(12) United States Patent
Kotagiri et al.

(10) Patent No.: US 12,425,037 B2
(45) Date of Patent: Sep. 23, 2025

(54) POLARITY DEPENDENT OFFSET IN ANALOG-TO-DIGITAL CONVERTERS

(71) Applicant: Infinera Corporation, San Jose, CA (US)

(72) Inventors: Shiva Prasad Kotagiri, San Jose, CA (US); Fu-Tai An, San Jose, CA (US)

(73) Assignee: Infinera Corporation

( * ) Notice: Subject to any disclaimer, the term of this patent is extended or adjusted under 35 U.S.C. 154(b) by 164 days.

(21) Appl. No.: 18/096,992

(22) Filed: Jan. 13, 2023

(65) Prior Publication Data
US 2023/0299779 A1    Sep. 21, 2023

Related U.S. Application Data

(60) Provisional application No. 63/299,506, filed on Jan. 14, 2022.

(51) Int. Cl.
*H04B 10/60*    (2013.01)
*H03M 1/06*    (2006.01)

(52) U.S. Cl.
CPC .......... *H03M 1/0607* (2013.01); *H04B 10/60* (2013.01)

(58) Field of Classification Search
CPC .... H03M 1/0607; H03M 1/466; H04B 10/60; H04B 10/556; H04B 10/69
See application file for complete search history.

(56) References Cited

U.S. PATENT DOCUMENTS

| | | | | |
|---|---|---|---|---|
| 8,659,461 B1* | 2/2014 | Zhu | ..................... | H03M 1/1019 341/155 |
| 8,957,803 B2* | 2/2015 | Balasubramaniam | ...................... | H03M 1/0678 341/172 |
| 2012/0306676 A1* | 12/2012 | Balasubramaniam | ...................... | H03M 1/0678 327/530 |
| 2014/0348515 A1* | 11/2014 | Tsubouchi | ........... | H04B 10/614 398/202 |
| 2017/0163279 A1* | 6/2017 | Kinyua | ................. | H03M 1/468 |

FOREIGN PATENT DOCUMENTS

| | | | | |
|---|---|---|---|---|
| CN | 101128980 A | * | 2/2008 | ............ H03M 1/004 |
| WO | WO-2021161163 A1 | * | 8/2021 | |

* cited by examiner

*Primary Examiner* — Kenneth N Vanderpuye

(57) ABSTRACT

Methods, systems, and apparatus, including computer programs encoded on computer storage media, for implementing a SAR ADC circuit with improved quantization error. In some implementations, an apparatus includes an analog-to-digital converter (ADC) configured to receive a set of voltage signals and generate digital representations of signals. The ADC comprises a capacitive digital-to-analog converter (CDAC) comprising a capacitive divider circuit, the capacitive divider circuit comprising (i) a first capacitor in parallel with a second capacitor in a first branch, (ii) a plurality of capacitors in a plurality of other respective branches, and (iii) the CDAC configured to receive the set of sampled voltages and adjust each set of the sampled voltages by a first voltage or a second voltage through selection of one or more capacitors of the (i) first capacitor and the second capacitor and (ii) one or more of the plurality of capacitors.

20 Claims, 12 Drawing Sheets

POLARITY DEPENDENT OFFSET IN ANALOG-TO-DIGITAL CONVERTERS

CROSS REFERENCE TO RELATED APPLICATION

This application claims priority from and the benefit of U.S. Provisional Patent Application No. 63/299,506, and filed on Jan. 14, 2022, which is incorporated herein by reference in its entirety.

FIELD

This disclosure generally relates to optical communication systems and polarity dependent offset in analog-to-digital converters.

BACKGROUND

Optical networks can be used to communicate data using light signals. Some components in the optical networks can communicate the light signals using subcarriers. Technical challenges arrive when a receiving optical system component attempts to process a particular one of the received subcarriers. In some cases, inefficiencies in the optical system components and noise effects from the channel can interfere with and cause potential errors in accurately recovering the subcarrier signal data at the receiver.

SUMMARY

This disclosure relates to implementing a successive approximation register (SAR) analog-to-digital converter (ADC) circuit with an improved quantization error for optical communication systems. Specifically, the SAR ADC circuit can convert a continuous analog waveform into a discrete digital representation using various components. The conversion can be performed, for example, utilizing a binary search through various possible quantization levels before converging upon a digital output that represents the continuous analog waveform for each conversion.

In some implementations, the SAR ADC circuit can include a sample and hold circuit, a capacitive digital to analog converter (CDAC), a comparator, and a SAR logic circuit. The sample and hold circuit can sample the voltage of an analog input signal for a specified amount of time. The CDAC can receive an output of the sample and hold circuit, and can connect a capacitive divider circuit to a ground or voltage line at various terminals of the capacitive divider circuit according to a digital code output by the SAR logic circuit. The CDAC can generate an analog voltage based on the data or instructions received from the SAR logic circuit that connects one or more terminals of the capacitive divider circuit to a ground or voltage line and the input voltage. In response, the CDAC can supply the generated analog voltage to the comparator. The SAR logic circuit can generate a digital representation associated with the input voltage and supply the digital code to the CDAC for connecting the capacitive divider circuit. The comparator can generate a voltage output based on a comparison between the input voltage and the generated analog voltage created by the CDAC. In response, the comparator can supply the generated voltage output to the SAR logic circuit. The process between the CDAC, the comparator, and the SAR logic circuit can operate using an iterative algorithm, such as a binary searching algorithm.

In some implementations, the SAR logic circuit can be initialized such that a most significant bit of the digital code is equivalent to a digital value of 1. The SAR logic circuit can supply this digital code to the CDAC. The CDAC can connect its terminals of the capacitive divider circuit to ground or voltage according to the analog equivalent of the digital code and produce a corresponding analog voltage to supply to the comparator. Based on the comparator's comparison, if the analog voltage exceeds the input voltage, then the comparator can instruct the SAR logic circuit to reset the bit, e.g., set the digital value of 1 to a digital value of 0. If the analog voltage does not exceed the input voltage, the digital value is left as 1. Then, the SAR logic circuit sets the next bit to 1, e.g., digital value of 11, and the same comparison is repeated. This process, formally known as a binary searching algorithm, is repeated until each bit output by the SAR logic circuit has been tested. Once each bit output by the SAR logic circuit has been tested, the resulting output digital code is a digital approximation of the sampled input voltage. The resulting output digital code is output by the SAR logic circuit at the end of the conversion, and provided to receiver digital signal processors. This process will be further described below.

In some implementations, the CDAC can employ a principle of charge redistribution to generate an analog output voltage. Specifically, the CDAC can include an array of N capacitors with binary weighted values plus an additional capacitor, labeled as a "dummy least significant bit (LSB)" capacitor. The array of N capacitors and the dummy LSB capacitor can connect to various components. For example, these components can be connected to one or more of a ground node, a voltage reference node, or an analog input voltage node. During the CDAC's acquisition phase, the terminals of the array of N capacitors can connect to the analog input voltage. After acquisition, the terminals of the array of N capacitors can be disconnected from the analog input voltage, thus trapping a charge proportional to the input voltage on the capacitor array. The amount of charge stored in each capacitor in the array is then used to perform the aforementioned binary search in conjunction with the comparator and the SAR logic circuit.

The techniques described in this specification can reduce a quantization error and improve a signal-to-quantization noise ratio (SQNR) associated with the SAR ADC circuit. Typically, a generic switching mechanism of the CDAC circuit that converts analog samples to digital code can obtain a quantization error that ranges from negative LSB to positive LSB, where LSB is represented as a resolution of the lease significant bit. Specifically, this generic switching mechanism can obtain a quantization error from 0 to LSB for positive voltage inputs and from negative LSB to 0 for negative voltage inputs. Such a quantization error from −LSB to +LSB can degrade a SAR ADC's signal SQNR across the received input voltages. For the ADCs with a resolution of 5 bits or above, a 2 decibel (dB) SQNR degradation exists from a theoretical SQNR limit computed with the uniformly distributed quantization error from −LSB/2 to +LSB/2.

As such, in order to reduce the quantization error in the SAR ADC to reach or approach the theoretical SQNR limit, a signal's sign dependent offset voltage can be applied in the conversion process. The signal's sign dependent offset voltage can be represented as +LSB/2 for positive input voltages and −LSB/2 for negative input voltages. For example, and as will be further described below, a value of the most significant bit (MSB) capacitor can be increased by half of the capacitance value of the LSB capacitor to shift a quantization error to be confined between −LSB/2 to +LSB/2. In this manner, the SQNR performance of the SAR ADC can be restored to the theoretical limit, as will be further illustrated below.

In one general aspect, an apparatus includes: one or more analog-to-digital converters (ADCs), each ADC configured to receive a set of voltage signals and generate, using the set of voltage signals, digital representations of signals, each ADC comprising: a sample and hold circuit configured to sample the received set of voltages and hold the sample for a period of time; a capacitive digital-to-analog converter (CDAC) comprising a capacitive divider circuit, the capacitive divider circuit comprising (i) a first capacitor in parallel with a second capacitor in a first branch, (ii) a plurality of other capacitors in a plurality of other respective branches, and (iii) the CDAC configured to receive the set of sampled voltages and adjust each set of the sampled voltages by a first voltage or a second voltage through selection of one or more capacitors of the (i) first capacitor and the second capacitor and (ii) one or more of the plurality of other capacitors, the one or more capacitors selected according to a position of each switch of the plurality of switches; a comparator circuit configured to generate a polarity value based on a difference between the adjusted set of the sampled voltages; and a successive approximation register (SAR) circuit configured to (i) receive the polarity value from the comparator, (ii) generate instructions to select the position of each switch of the plurality of switches in the CDAC, (iv) transmit the instructions to the CDAC, (iv) generate a digital representation from the polarity value, and (v) output the digital representation to a digital signal processor.

Other implementations of this and other aspects of the disclosure include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue having instructions that, when executed by data processing apparatus, cause the apparatus to perform the actions.

The foregoing and other implementations can each include one or more of the following features, alone or in combination. For example, one implementation includes all the following features in combination.

In some implementations, the apparatus includes: a demodulator configured to: receive data over an optical link; receive a local oscillator signal from a local oscillator; process the received data based on the local oscillator signal to generate a resulting signal; and output the resulting signal to a detector; and the detector configured to provide the set of voltage signals based on the resulting signal from the demodulator to the ADC.

In some implementations, the ADC is configured to utilize a binary search to generate the digital representation from the polarity value using the received set of voltages.

In some implementations, the apparatus includes: a first ADC configured to receive a set of voltage signals having an X-polarization and generate, using the set of voltage signals having the X-polarization, digital representations of X-polarized signals to provide as output to the digital signal processor; and a second ADC configured to receive a set of voltage signals having a Y-polarization and generate, using the set of voltage signals having the Y-polarization, digital representations of Y-polarized signals to provide as output to the digital signal processor.

In some implementations, the apparatus includes: the digital signal processor configured to receive the digital representation from the SAR circuit and process the digital representation.

In some implementations, the first capacitor has a value of 0.5 times the capacitance of an LSB capacitor in the plurality of other capacitors.

In some implementations, the first branch and the other respective branches of the capacitive divider circuit represents binary coefficients indicative of positions of each switch of the plurality of switches.

In one general aspect, a receiver includes: an analog-to-digital converter (ADC) configured to process a set of voltage signals provided by a detector and generate, using the set of voltage signals, digital representations of signals to provide as output to a digital signal processor, the ADC comprising: a sample and hold circuit configured to sample the set of voltages and hold sample voltages for a period of time; a capacitive digital-to-analog converter (CDAC) comprising a capacitive divider circuit, the capacitive divider circuit comprising (i) a first capacitor in parallel with a second capacitor in a first branch of the capacitive divider circuit, (ii) a plurality of other capacitors in a plurality of other respective branches of the capacitive divider circuit, and (iii) a plurality of switches for connecting the first capacitor, the second capacitor, and the plurality of other capacitors to a first voltage or a second voltage, the CDAC configured to receive the sample voltages and adjust each of the sample voltages by the first voltage or the second voltage through selection of one or more capacitors of the first capacitor, the second capacitor, and the plurality of other capacitors, capacitances of the one or more capacitors selected according to a position of each switch of the plurality of switches; a comparator circuit configured to generate a polarity value based on a difference between the adjusted sample voltages; and a successive approximation register (SAR) circuit configured to (i) receive the polarity value from the comparator circuit, (ii) generate instructions to select the position of each switch of the plurality of switches in the CDAC, (iv) transmit the instructions to the CDAC, (iv) generate a digital representation from the polarity value, and (v) output the digital representation to the digital signal processor.

In some implementations, the receiver includes: a demodulator configured to: receive data over an optical link; receive a local oscillator signal from a local oscillator; process the received data based on the local oscillator signal to generate a resulting signal; and output the resulting signal to the detector; and the detector configured to provide the set of voltage signals based on the resulting signal from the demodulator to the ADC.

In some implementations, the ADC is configured to utilize a binary search to generate the digital representation from the polarity value using the set of voltages.

In some implementations, the receiver includes: a first ADC configured to receive a set of voltage signals having an X-polarization and generate, using the set of voltage signals having the X-polarization, digital representations of X-polarized signals to provide as output to the digital signal processor; and a second ADC configured to receive a set of voltage signals having a Y-polarization and generate, using the set of voltage signals having the Y-polarization, digital representations of Y-polarized signals to provide as output to the digital signal processor.

In some implementations, the first voltage is a ground voltage and the second voltage is a reference voltage that is not grounded.

In some implementations, the first capacitor has a value of 0.5 times the capacitance of an LSB capacitor in the plurality of other capacitors.

In some implementations, the first branch and the other respective branches of the capacitive divider circuit represents binary coefficients indicative of positions of each switch of the plurality of switches.

In some implementations, the first branch that comprises the first capacitor in parallel with the second capacitor represents a most significant bit (MSB) of the binary coefficients.

In some implementations, the receiver further includes a quantization error profile of the CDAC is uniformly distributed between −LSB/2 to LSB/2 across the set of voltage signals.

In one general aspect a, a device includes: a capacitive digital-to-analog converter (CDAC) comprising a capacitive divider circuit, the capacitive divider circuit comprising (i) a first set of branches connected to either a first voltage or a second voltage, the first set of branches comprising a first branch with a first set of parallel capacitors, (ii) a second set of branches connected to the first voltage or the second voltage, the second set of branches comprising a second branch with a second set of parallel capacitors, and (iii) each branch of the first set of branches connected to a positive input of a comparator and each branch of the second set of branches connected to a negative input of the comparator, the CDAC configured to receive a set of sampled voltages and adjust each set of the sampled voltages by the first voltage or the second voltage through selection of a plurality of switches.

In some implementations, the first voltage is ground and the second voltage is a reference voltage.

In some implementations, the first branch comprises a first capacitor in parallel with a second capacitor.

In some implementations, the capacitor has a value of 0.5 times the capacitance of an LSB capacitor in the second set of parallel capacitors.

The subject matter described in this specification can be implemented in various implementations and may result in one or more of the following advantages. In some implementations, an SAR ADC can improve its SQNR and reduce its quantization error by applying a polarity dependent offset. Specifically, the SAR ADC can confine a quantization error between a negative least significant bit (LSB)/2 to a positive LSB/2, where LSB is represented as a resolution of the least significant bit of the SAR ADC.

The details of one or more implementations of the subject matter of this specification are set forth in the accompanying drawings and the description below. Other aspects, features and advantages will become apparent from the description, the drawings, and the claims.

BRIEF DESCRIPTION OF THE DRAWINGS

Like reference numbers and designations in the various drawings indicate like elements.

DETAILED DESCRIPTION

In some implementations, a successive approximation register (SAR) analog-to-digital converter (ADC) circuit is a type of converter that can convert a continuous analog waveform into a discrete digital representation. Specifically, the SAR ADC circuit can utilize various techniques for identifying the discrete digital representation of a received continuous analog waveform. For example, the successive-approximation ADC circuit can utilize a binary search and search through all possible quantization levels before finally identifying the discrete digital representation. The SAR ADC described throughout this specification can reduce an overall quantization error of the input voltages by applying a polarity dependent offset, as will be further described below.

Figure 1:
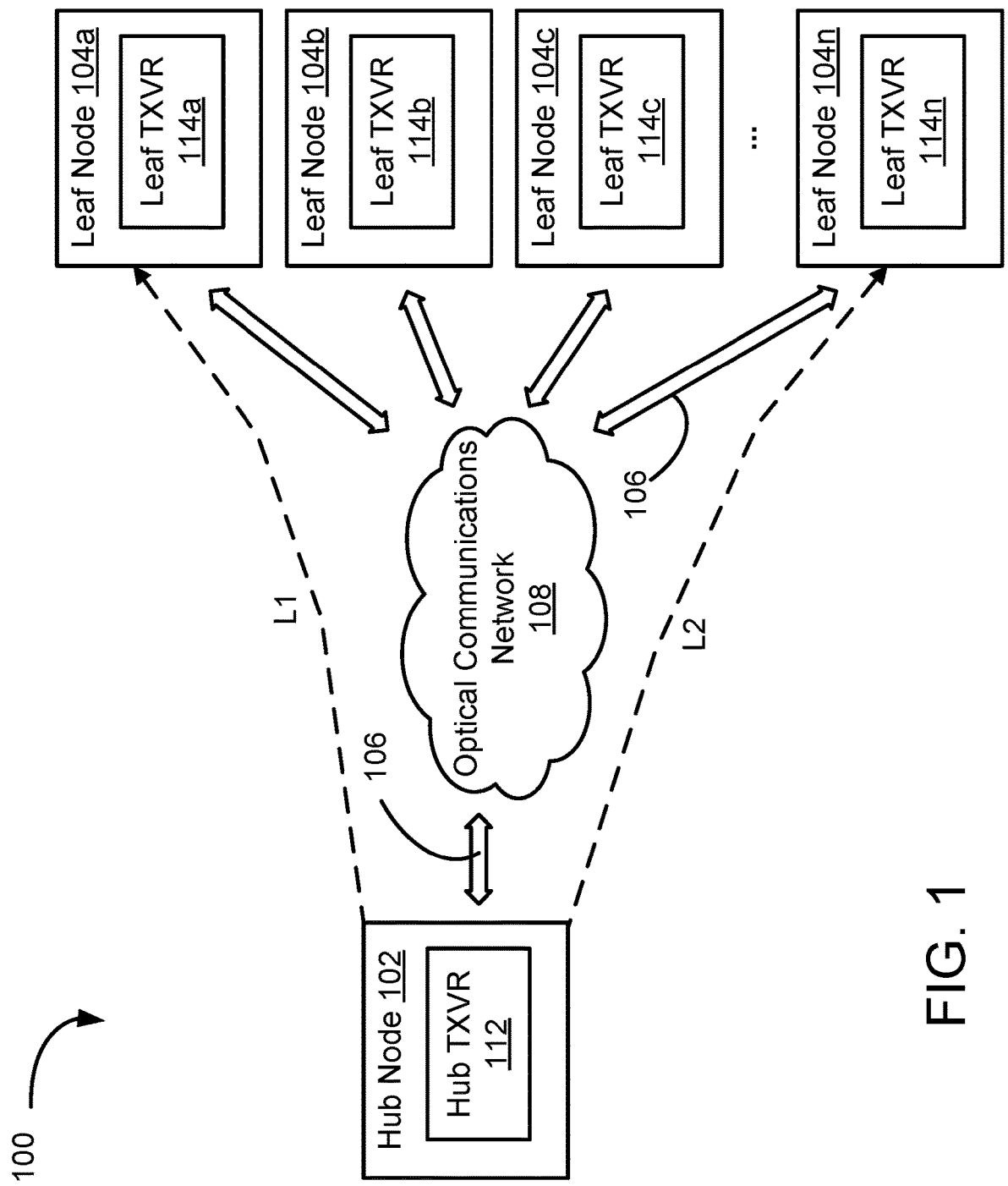
FIG. 1 is an illustration of an example communication system including a hub node, leaf nodes, and an optical communications network.

FIG. 1 depicts an example communication system 100. The communication system 100 can include wired and/or wireless communication systems, and, in some implementations, can be an optical communication network 108. The communication system 100 can be a point-to-point communication system or a point-to-multi-point communication system. For example, communication system 100 includes a hub node 102 and leaf nodes 104a-104n that are communicatively coupled to one another by optical links 106 in an optical communication network 108. In some implementations, the system 100 can be a part of one or more optical transport networks (OTNs) and/or can include one or more OTNs.

Each of the network nodes 102 and 104a-104n can include one or more respective computer devices (e.g., server computer, router, client computer, laptop, desktop). In some implementations, the network nodes can be configured such that each of the network nodes transmits data to and/or receives data from one or more other network nodes. As an example, the hub node 102 can be configured to transmit data to and/or receive data from one or more of the leaf nodes 104a-104n. For instance, hub node 102 can transmit data over an optical link L1 to leaf node 104a and transmit data over another optical link L2 to leaf node 104n. System 100 can include any number of network nodes greater than one (e.g., two, three, four, or more).

Each of the network nodes 102 and 104a-104n can include one or more transmitters and one or more receivers (which, in some implementations, can be combined as one or more transceivers) for transmitting and/or receiving data via the optical links 106 and the optical communications network 108. As an example, the hub node 102 can include a hub transceiver 112 that is coupled to one or more optical links 106. As another example, each of the leaf nodes 104a-104n can include a respective leaf transceiver 114a-114n that is coupled to one or more of the optical links 106. Each of the optical links 106 can be implemented using one or more lengths of optical fiber and/or equipment interconnecting the optical fiber (e.g., line system components). In some implementations, the optical links 106 can collectively define at least a portion of the optical communications network 108.

Figure 4:
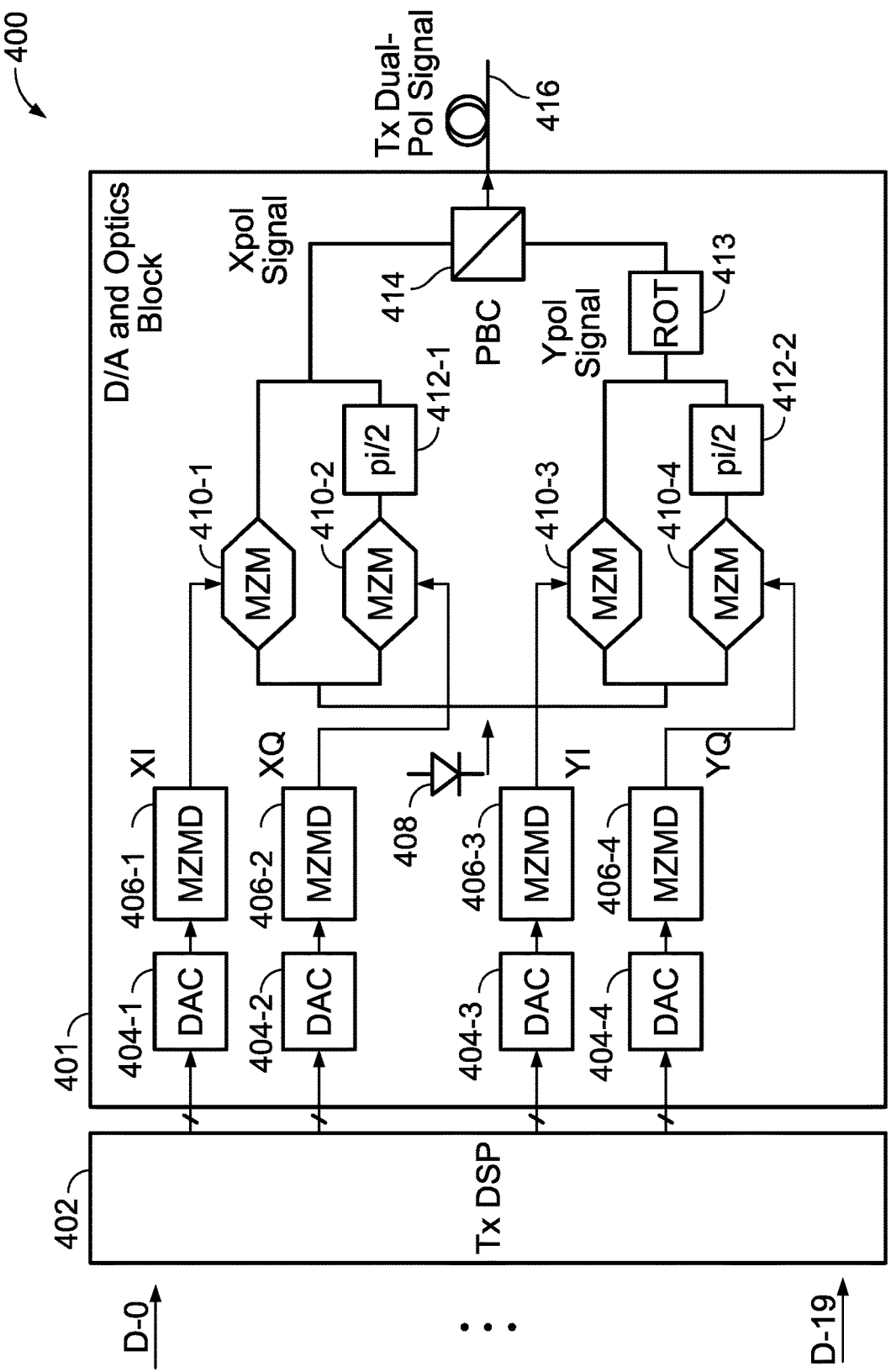
FIG. 4 is a diagram illustrating an example of components of an optical transmitter.

Example implementations of a transmitter and receiver are described with respect to FIGS. 4-9. FIG. 4 depicts an example transmitter 400 that includes a plurality of switches SW and circuits that include a transmitter Digital Signal Processor DSP (Tx DSP) 402 and a Digital-to-Analog (D/A) and optics block 401. In some cases, transmitter 400 can be part of any one of transceivers 112, 114a-114n shown in FIG. 1. In the example shown in FIG. 4, the DSP 402 can receive one or more of the data streams D-0 to D-19. Specifically, each input to the DSP 402 can be received as the inputs to FEC encoders 502 described below (see FIG. 5).

Each of the leaf nodes 104a, 104b, 104c, and 104d can output a number of subcarriers and provided to the DSP 402. Circuits, such as DSP 402, can similarly be included in a leaf node Tx DSP to adjust or control the number of subcarriers output therefrom.

Based on the number of subcarriers, e.g., D-0 through D-19, DSP 402 can supply a plurality of outputs to D/A and Optics Block 401 including digital-to-analog conversion (DAC) circuits 404-1 to 404-4, which convert digital signal received from DSP 402 into corresponding analog signals. D/A and Optics Block 401 also includes driver Mach-Zehnder Modulator Driver (MZMD) circuits 406-1 to 406-4 that receive the analog signals from DACs 404-1 to 404-4 and adjust the voltages or other characteristics thereof to provide drive signals to a corresponding one of modulators 410-1 to 410-4.

One or more of each of the modulators 410-1 to 410-4 can be a Mach-Zehnder modulator (MZM) that modulates the phase and/or amplitude of the light output from laser 408. The optical light signal output from laser 408, also included in block 401, is split such that a first portion of the light is supplied to a first MZM pairing, including MZMs 410-1 and 410-2, and a second portion of the light is supplied to a second MZM pairing, including MZMs 410-3 and 410-4. The first portion of the optical light signal is split further into third and fourth portions, such that the third portion is modulated by MZM 410-1 to provide an in-phase (I) component of an X (or TE) polarization component of a modulated optical signal, and the fourth portion is modulated by MZM 410-2 and fed to phase shifter 412-1 to shift the phase of such light by 90 degrees in order to provide a quadrature (Q) component of the X polarization component of the modulated optical signal. Similarly, the second portion of the optical light signal is further split into fifth and sixth portions, such that the fifth portion is modulated by MZM 410-3 to provide an I component of a Y (or TM) polarization component of the modulated optical signal, and the sixth portion is modulated by MZM 410-4 and fed to phase shifter 412-2 to shift the phase of such light by 90 degrees to provide a Q component of the Y polarization component of the modulated optical signal.

The optical outputs of MZM 410-1 and phase shifter 412-1 are combined to provide an X polarized optical signal including I and Q components and are fed to a polarization beam combiner (PBC) 414. In addition, the outputs of MZM 410-3 and phase shifter 412-2 are combined to provide an optical signal that is fed to polarization rotator 413 that rotates the polarization of such optical signal to provide a modulated optical signal having a Y (or TM) polarization. The Y polarized modulated optical signal also is provided to PBC 414, which combines the X and Y polarized modulated optical signals to provide a polarization multiplexed ("dual-pol") modulated optical signal onto optical fiber 416, for example, which can be included as a segment of optical fiber in an optical communication path.

While FIG. 4 shows transmitter 400 as including a particular number and arrangement of components, in some implementations, transmitter 400 can include additional components, fewer components, different components, or differently arranged components. The number of DACs 404, MZMD 406 circuits, and/or MZM circuits 410 can be selected to implement a transmitter 400 that is capable of receiving a polarization multiplexed signal. In some instances, one of the components illustrated in FIG. 4 can carry out a function described herein as being carry out by another one of the components illustrated in FIG. 4.

Figure 5:
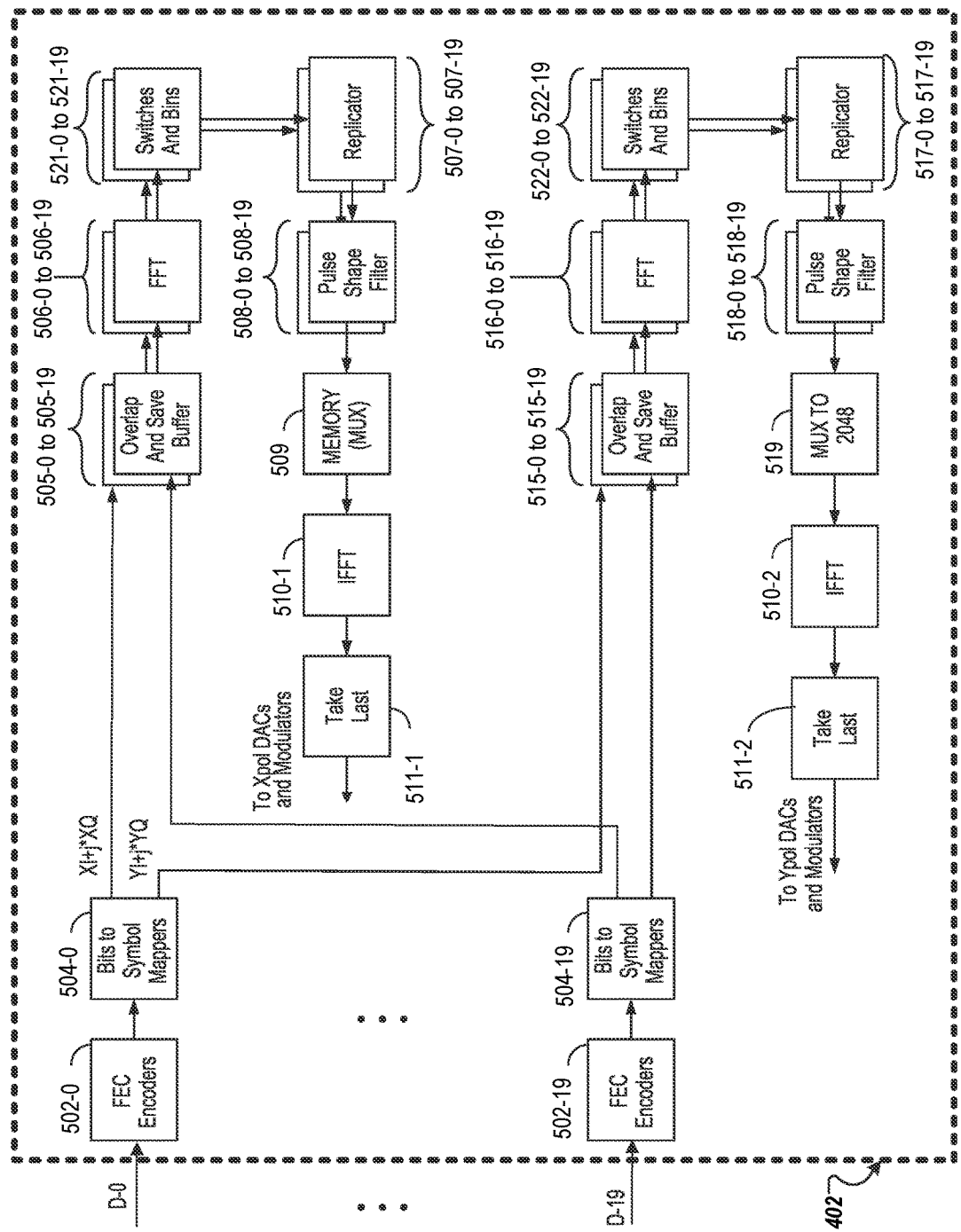
FIG. 5 is a diagram illustrating an example of components of a digital signal processor of the transmitter shown in FIG. 4.

FIG. 5 shows an example of Tx DSP 402 in greater detail. Tx DSP 402 can include FEC encoders 502-0 to 502-19, each of which can receive data streams D-0 to D-19 that include subcarriers SC0 to SC19, which each have X and Y polarization components and I and Q components. Each subcarrier SC0 to SC19 can be associated with or corresponds to a respective one of the data streams D0 to D19. For example, DSP 402 provides outputs that result in optical subcarriers SC0 through SC19 which carry information indicative of a respective one of data streams D0 through D19.

FEC encoders 502-0 to 502-19 can perform forward error correction coding on a corresponding one of the d, such as, by adding parity bits to the received data. In addition, FEC encoders 502-0 to 502-19 can interleave data.

Each of FEC encoders 502-0 to 502-19 provides an output to a corresponding one of a plurality of bits-to-symbol circuits, 504-0 to 504-19 (collectively referred to herein as "804"). Each of bits-to-symbol mapping circuits (mappers) 504 can map the m-encoded bits to symbols (where m is a whole number greater than or equal to 2) on a complex plane.

In some implementations, the bits-to-symbol mappers 504 can map four bits (m=4) to an X symbol+Y symbol in a dual-polarization QPSK constellation. Each of bits-to-symbol mappers 504 provide first symbols, having the complex representation XI+j*XQ, associated with a respective one of the data streams, such as, D-0, to DSP 402. Data indicative of such first symbols is carried by the X polarization component of each subcarrier SC0-SC19.

Each of bits-to-symbol mappers 504 further can provide second symbols having the complex representation YI+j*YQ, also associated with a corresponding output of data streams D0-D9. Data indicative of such second symbols, however, is carried by the Y polarization component of each of subcarriers SC-0 to SC-19.

Such mapping, as performed by mappers 504-0 to 504-19 provides, in one example, a particular modulation format for each subcarrier. That is, such circuit can configure a mapping for all the optical subcarrier that is indicative of a binary phase shift keying (BPSK) modulation format, a quadrature phase shift keying (QPSK) modulation format, or an m-quadrature amplitude modulation (QAM), where m is a positive integer, e.g., 4, 8, 16, or 64) format. In another example, one or more of the optical subcarriers can have a modulation format that is different than the modulation format of other optical subcarriers. That is, one of the optical subcarriers can have a QPSK modulation format and another optical subcarrier can have a different modulation format, such as 8-QAM or 16-QAM. In another example, one of the optical subcarriers has an 8-QAM modulation format and another optical subcarrier has a 16 QAM modulation format. Accordingly, although all the optical subcarriers can carry data at the same data and or baud rate, consistent with an aspect of the present disclosure one or more of the optical subcarriers can carry data at a different data or baud rate than one or more of the other optical subcarriers. Baud rate corresponds to one over the symbol duration. Moreover, modulation formats, baud rates and data rates can be changed over time depending on, for example, capacity requirements. Adjusting such parameters can be achieved, for example, by applying appropriate signals to mappers 504 based on control information or data described herein and the communication of such data as further disclosed herein between primary and secondary nodes.

As further shown in FIG. 5, each of the first symbols output from each of bits-to-symbol mappers 504 is supplied to a respective one of first overlap and save buffers 505-0 to 505-19 (collectively referred to herein as overlap and save buffers 505) that can buffer, for example, 256 symbols. Each of overlap and save buffers 505 can receive, for example, 128 of the first symbols or another number of such symbols at a time from a corresponding one of bits-to-symbol mappers 504. Thus, overlap and save buffers 505 can combine, for example, 128 new symbols from bits to symbol circuits 504, with the previous 128 symbols received from bits to symbol circuits 504.

Each overlap and save buffer 505 can supply an output, which is in the time domain, to a corresponding one of fast Fourier Transform (FFT) circuits 506-0 to 506-19 (collectively referred to as "FFTs 506"). In one example, the output includes 256 symbols or another number of symbols. Each of FFTs 506 can convert the received symbols to the frequency domain using or based on, for example, a fast Fourier transform. Each of FFTs 506 can provide the frequency domain data to bins and switches blocks 521-0 to 521-19. Bins and switches blocks 521 can include, for example, memories or registers, also referred to as frequency bins (FB) or points, that store frequency components associated with each subcarrier SC.

Each switch SW can selectively supply either frequency domain data output from one of FFT circuits 506-0 to 506-19 or a predetermined value, such as 0. In order to block or eliminate transmission of a particular subcarrier, the switches SW associated with the group of frequency bins FB associated with that subcarrier are configured to supply the zero value to corresponding frequency bins. Replicator components 507 as well as other components and circuits in DSP 402 can further process the zero (0) values to provide drive signals to modulators 410, such that subcarrier $SC_0$ is omitted from the optical output from the modulators.

On the other hand, some switches SW' (not shown) can be configured to supply the outputs of FFTs 506, i.e., frequency domain data FD, to corresponding frequency bins FB. Further processing of the contents of frequency bins FB by replicator components 507 and other circuits in DSP 402 can result in drive signals supplied to modulators 410, whereby, based on such drive signals, optical subcarriers are generated that correspond to the frequency bin groupings associated with that subcarrier.

Each of replicator components or circuits 507-0 to 507-19 can replicate the contents of the frequency bins FB and store such contents (e.g., for T/2 based filtering of the subcarrier) in a respective one of the plurality of replicator components. Such replication can increase the sample rate. In addition, replicator components or circuits 507-0 to 507-19 can arrange or align the contents of the frequency bins to fall within the bandwidths associated with pulse-shape filter circuits 508-0 to 508-19 described below.

Each of pulse-shape filter circuits 508-0 to 508-19 can apply a pulse-shaping filter to the data stored in the frequency bins of a respective one of the plurality of replicator components or circuits 507-0 to 507-19 to thereby provide a respective one of a plurality of filtered outputs, which are multiplexed and subject to an inverse FFT, as described below. Pulse-shape filter circuits 508-1 to 508-19 calculate the transitions between the symbols and the desired subcarrier spectrum so that the subcarriers can be packed together spectrally for transmission, e.g., with a close frequency separation. Pulse-shape filter circuits 508-0 to 508-19 also can be used to introduce timing skew between the subcarriers to correct for timing skew induced by links between nodes in the transmitter 400, for example. Multiplexer component 509, which can include a multiplexer circuit or memory, can receive the filtered outputs from pulse-shape filter circuits 508-0 to 508-19, and multiplex or combine such outputs together to form an element vector.

Next, IFFT circuit or component 510-1 can receive the element vector and provide a corresponding time domain signal or data based on an inverse fast Fourier transform (IFFT). In one example, the time domain signal can have a rate of 64 GSample/s. Take last buffer or memory circuit 511-1, for example, can select the last 1024 samples, or another number of samples, from an output of IFFT component or circuit 510-1 and supply the samples to DACs 404-1 and 404-2 (see FIG. 4) at 64 GSample/s, for example. As noted above, DAC 404-1 is associated with the in-phase (I) component of the X pol signal, and DAC 404-2 is associated with the quadrature (Q) component of the X pol signal. Accordingly, consistent with the complex representation XI+jXQ, DAC 404-1 receives values associated with XI and DAC 404-2 receives values associated with jXQ. As indicated by FIG. 4, based on these inputs, DACs 404-1 and 404-2 can provide analog outputs to MZMD 406-1 and MZMD 406-2, respectively, as discussed above.

As further shown in FIG. 5, each of bits-to-symbol mapping circuits (mappers) 504-0 to 504-19 can output a corresponding one of symbols indicative of data carried by the Y polarization component of the polarization multiplexed modulated optical signal output on fiber 116. As further noted above, these symbols can have the complex representation YI+j*YQ. Each such symbol can be processed by a respective one of overlap and save buffers 515-0 to 515-19, a respective one of FFT circuits 516-0 to 516-19, a respective one of replicator components or circuits 517-0 to 517-19, pulse-shape filter circuits 518-0 to 518-19, multiplexer or memory 519, IFFT 510-2, and take last buffer or memory circuit 511-2, to provide processed symbols having the representation YI+j*YQ in a manner similar to or the same as that discussed above in generating processed symbols XI+j*XQ output from take last circuit 511-1. In addition, symbol components YI and YQ are provided to DACs 404-3 and 404-4 (FIG. 4), respectively. Based on these inputs, DACs 404-3 and 404-4 can provide analog outputs to MZMD 406-3 and MZMD 406-4, respectively, as discussed above.

While FIG. 5 shows DSP 402 as including a particular number and arrangement of functional components, in some implementations, DSP 402 can include additional functional components, fewer functional components, different functional components, or differently arranged functional components. In addition, the number of overlap and save buffers, FFTs, replicator circuits, and pulse-shape filters associated with the X component can be equal to the number of switch outputs, and the number of such circuits associated with the Y component can also be equal to the number of switch outputs. However, in other examples, the number of switch outputs can be different from the number of these circuits.

As noted above, based on the outputs of MZMDs 406-1 to 406-4, a plurality of optical subcarriers $SC_0$ to $SC_{19}$ can be output onto communication channel, such as an optical fiber 416 (FIG. 4).

Figure 6:
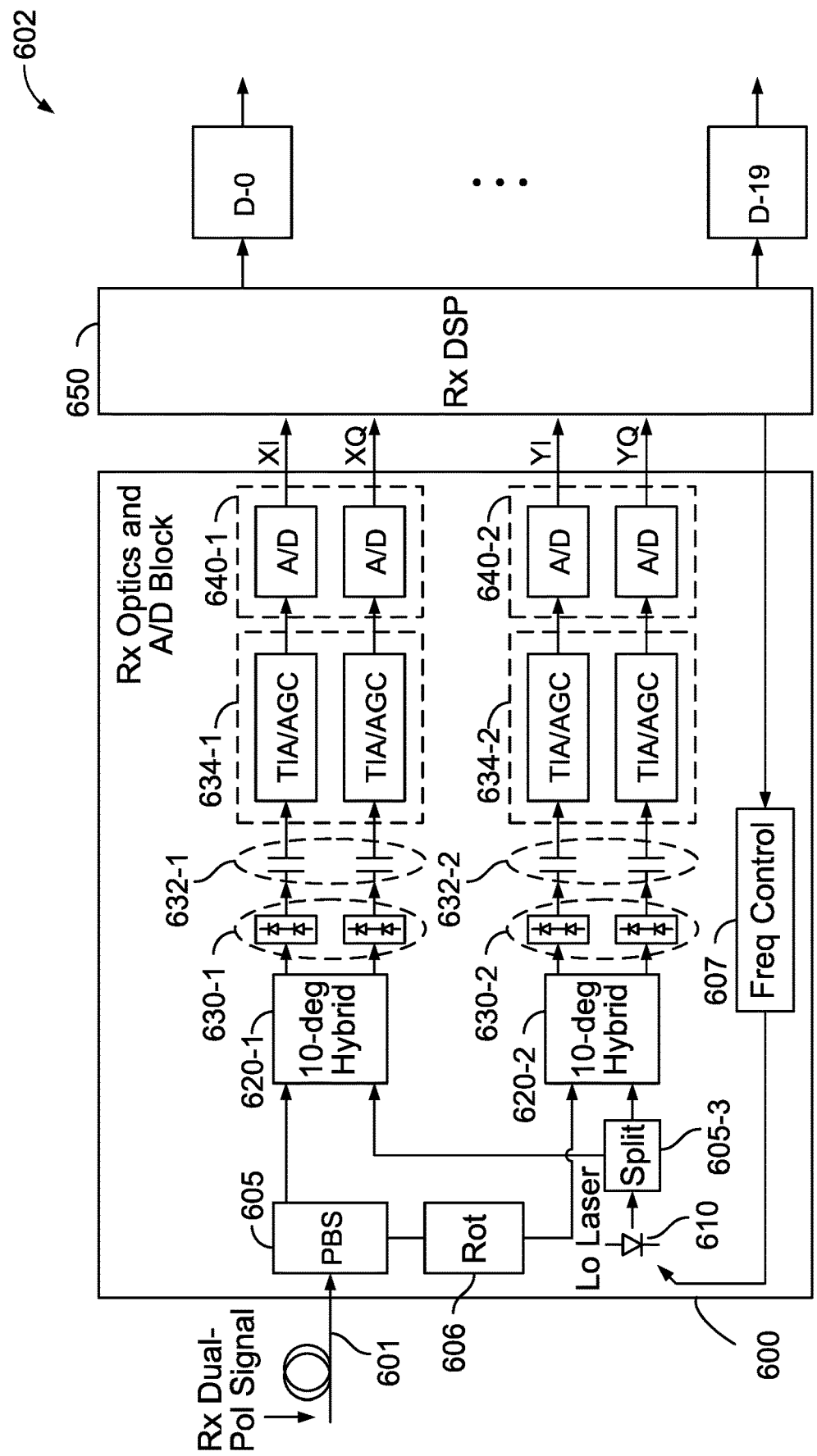
FIG. 6 is a block diagram illustrating components of an example receiver.

FIG. 6 depicts an example of a receiver (Rx) such as receiver 602 that includes an Rx optics and A/D block 600 and Rx DSP 650 to receive signals transmitted over optical fiber 416 and to perform coherent detection. In some cases, receiver 602 can be part of any one of transceivers 112, 114a-114n shown in FIG. 1.

The Rx optics and A/D block 600 can include a polarization splitter (PBS) 605 with first and second outputs, a splitter 605-3, a local oscillator (LO) laser 610, 10 degree optical hybrid circuits or mixers 620-1 and 620-2 (referred to generally as hybrid mixers 620 and individually as hybrid mixer 620), detectors 630-1 and 630-2 (referred to generally as detectors 630 and individually as detector 630, each including either a single photodiode or balanced photodiode), alternating current (AC) coupling capacitors 632-1 and 632-2, transimpedance amplifiers/automatic gain control circuits transimpedance/automatic gain control (TIA/AGC) 634-1 and 634-2, analog-to-digital converters (ADCs) 640-1 and 640-2 (referred to generally as ADCs 640 and individually as ADC 640).

Polarization beam splitter (PBS) 605 can include a polarization splitter that receives an input polarization multiplexed optical signal including optical subcarriers $SC_0$ to $SC_{19}$ supplied by optical fiber link 601, which can be, for example, an optical fiber segment as part of the optical communication network 108 or optical fiber 416. PBS 605 can split the incoming optical signal into the two X and Y orthogonal polarization components. The Y component can be supplied to a polarization rotator 606 that rotates the polarization of the Y component. Hybrid mixers 620 can receive and combine the X and rotated Y polarization components with light from local oscillator laser 610, which, in one example, is a tunable laser. For example, hybrid mixer 620-1 can combine a first polarization signal (e.g., the component of the incoming optical signal having a first or X (TE) polarization output from a first PBS port with light from local oscillator 610, and hybrid mixer 620-2 can combine the rotated polarization signal (e.g., the component of the incoming optical signal having a second or Y (TM) polarization output from a second PBS port) with the light from local oscillator 610. In one example, polarization rotator 606 can be provided at the PBS output to rotate the Y component polarization.

Detectors 630 can detect mixing products output from the optical hybrid mixers 620, to form corresponding voltage signals, which are subject to AC coupling by capacitors 632-1 and 632-1, as well as amplification and gain control by TIA/AGCs 634-1 and 634-2. The outputs of TIA/AGCs 634-1 and 634-2 and ADCs 640 can convert the voltage signals to digital samples. For example, two detectors (e.g., photodiodes) 630-1 can detect the X polarization signals to form the corresponding voltage signals, and a corresponding two ADCs 640-1 can convert the voltage signals to digital samples for the first polarization signals after amplification, gain control and AC coupling. Similarly, two detectors 630-2 can detect the rotated Y polarization signals to form the corresponding voltage signals, and a corresponding two ADCs 640-2 can convert the voltage signals to digital samples for the second polarization signals after amplification, gain control and AC coupling. Rx DSP 650 can process the digital samples associated with the X and Y polarization components to output data associated with one or more subcarriers within a group of subcarriers.

While FIG. 6 shows receiver 602 as including a particular number and arrangement of components, in some implementations, receiver 602 can include additional components, fewer components, different components, or differently arranged components. The number of detectors 630 and/or ADCs 640 can be selected to implement a receiver 602 that is capable of receiving a polarization multiplexed signal. In some instances, one of the components illustrated in FIG. 6 can carry out a function described herein as being carry out by another one of the components illustrated in FIG. 6.

Consistent with the present disclosure, in order to select a particular subcarrier or group of subcarriers at a secondary node, local oscillator 610 can be tuned to output light having a wavelength or frequency relatively close to the selected subcarrier wavelength(s) to thereby cause a beating between the local oscillator light and the selected subcarrier(s). Such beating will either not occur or will be significantly attenuated for the other non-selected subcarriers so that data carried by the selected subcarrier(s) is detected and processed by Rx DSP 650.

The local oscillator frequency can be tuned, for example, by changing the temperature of the local oscillator laser 610 to realize corresponding shifts in the bandwidth to encompass a different group of subcarriers than were detected prior to such bandwidth shift. The temperature of the local oscillator laser 610 can be controlled with a thin film heater. Alternatively, the local oscillator laser can be frequency tuned by controlling the current supplied to the laser 610. The local oscillator laser 610 can be a semiconductor laser, such as a distributed feedback laser or a distributed Bragg reflector laser.

As further shown in FIG. 6, the Rx DSP 650 can output the data detected from the received subcarriers, e.g., D-0 through D-19. Accordingly, for example, if data carried by a number of subcarriers is intended to be output at a particular leaf node 104a, 104b, 104c, 104d, the Rx DSP 650 at each particular leaf node can supply the desired data for further processing.

Figure 7:
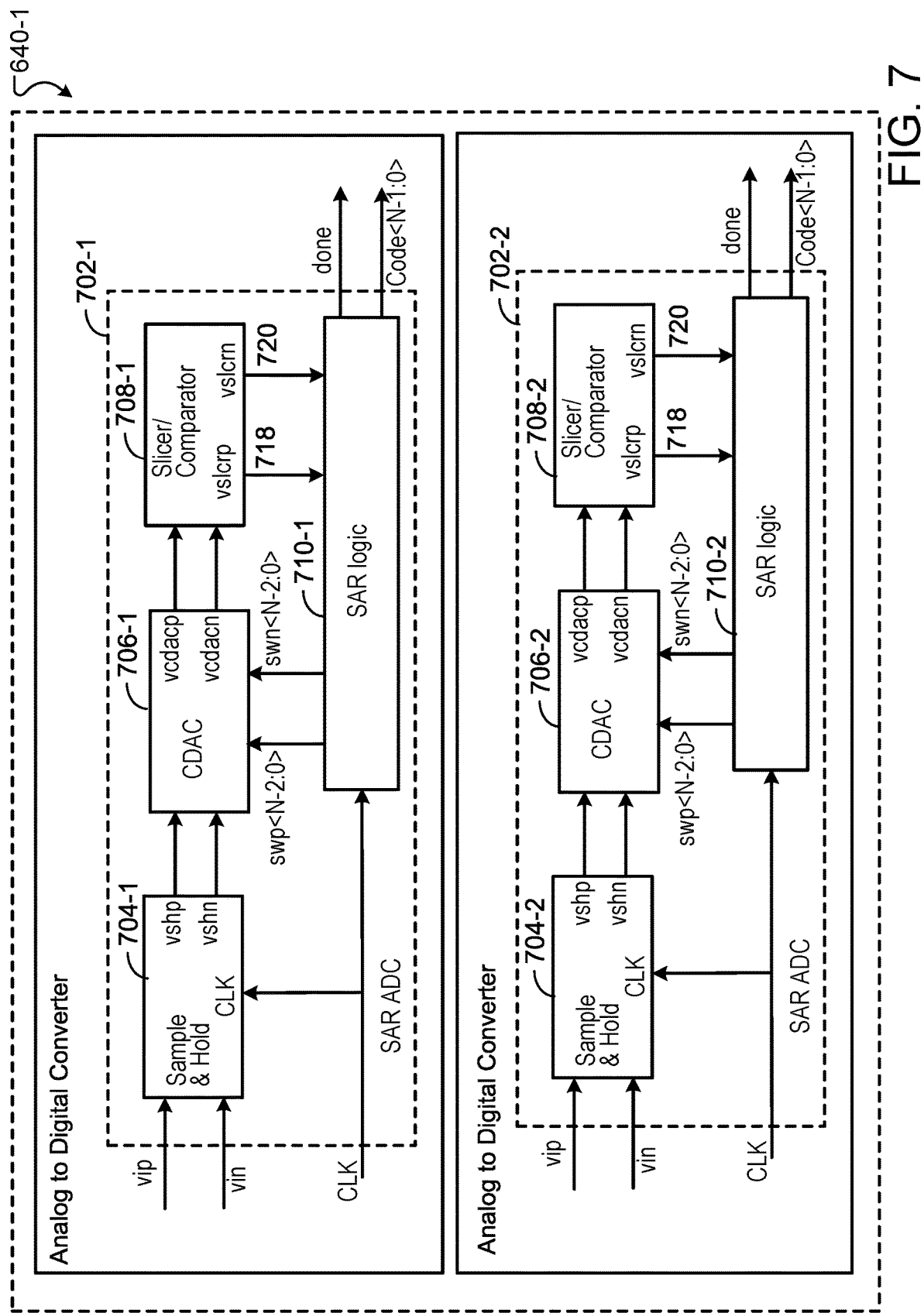
FIG. 7 is a block diagram illustrating components of an analog-to-digital converter (ADC) in the receiver shown in FIG. 6.

FIG. 7 is a block diagram illustrating components of ADCs 640-1 in the receiver shown in FIG. 6. Although only two ADC sub-blocks are shown as part of ADCs 640-1, in some implementations, more than two ADC sub-blocks may be included in ADC 640-1. Turning to FIG. 7, ADCs 640-1 illustrates the components of two ADC subblocks, ADC 702-1 and ADC 702-2. In some implementations, subblocks ADC 702-1 and ADC 702-2 can also be utilized in one or more of the two ADCs of 640-2. ADC 702-1 can perform conversion on an X polarization voltage signal to digital samples and ADC 702-2 can perform conversion on a Y polarization voltage signal to digital samples. The ADCs 640-1 can be configured to identify a quantization level that is within a resolution of a least significant bit (LSB) using binary search, for example.

In some implementations, the ADC 702-1 can include a sample and hold circuit 704-1, a capacitive digital-to-analog converter (CDAC) 706-1, a slicer or comparator 708-1, and an SAR logic circuit 710-1. Similarly, the ADC 702-2 can include a sample and hold circuit 704-2, a CDAC 706-2, a slicer or comparator 708-2, and an SAR logic circuit 710-2. As such, each ADC in block 640-1 (and block 640-2) can include a sample and hold circuit 704, a CDAC 706, a slicer or comparator 708, and an SAR logic circuit 710. The ADCs 702-1 and 702-2 can also include fewer or additional components. In the following description of the components in ADC sub-blocks 702-1 and 702-2, descriptions of a particular component (e.g., SAR logic circuit 710) apply to the corresponding components (e.g., SAR logic circuit 710-1 and 710-2) in both sub-blocks 702-1 and 702-2.

For instance, in some implementations, the sample and hold circuit 704 can sample a voltage of an analog input signal for a specified amount of time. For example, the sample and hold circuit 704 can receive a positive input voltage ($v_{ip}$ of 5 volts (V) and a negative input voltage ($v_{in}$) of −5 V, sample and hold the +5 V and −5 V for a predetermined period of time, e.g., 0.2 milliseconds, and output the sampled and hold 5 V on the ($V_{shp}$) line and −5 V on the negative line ($V_{shn}$) to the CDAC 706. In this manner, discrete input voltage values are provided to the CDAC 706-1.

The CDAC 706 can connect a capacitive divider circuit to a ground or voltage line at various terminals of the capacitive divider circuit according to a digital code output by the SAR logic circuit 710. The CDAC 706 can produce an analog voltage based on the connections instructed by the SAR logic circuit 710 and can supply the generated analog voltage to the comparator 708.

The SAR logic circuit 710 can generate a digital code of the input voltage and supply the digital code to the CDAC 706. Specifically, the SAR logic circuit 710 can supply the digital code as positive switches ($sw_p$) and negative switches ($sw_n$). For example, if the SAR logic circuit 710 receives voltages values from the comparator 708-1 to turn on the most significant bit (MSB) branch on the positive terminal, then the SAR logic circuit 710 can output the switches value of "1000" for $sw_p$ and "0000" for $sw_n$. A digital value of "1" represents turning a switch on, and connecting the switch of a terminal of the capacitive divider circuit to a voltage line. A digital value of "0" represents turning a switch off, and connecting the switch of a terminal of the capacitive divider to a ground line.

The comparator 708 can generate a voltage output based on a comparison between the input voltages to the generated analog voltage created by the CDAC 706. For example, the comparator 708 can receive a positive voltage from the CDAC 706 ($vcdac_p$) and a negative voltage from the CDAC 706 ($vcdac_n$) and compare $vcdac_p$ to $vcdac_n$. In response to the comparison, the comparator 708 can supply the generated voltage output to the SAR logic circuit 710 as positive output voltage ($vslcr_p$) 718 and negative output voltage ($vslcr_n$) 720. In some examples, the comparator 708 can output 1 V for $vslcr_p$ 718 and 0 V for $vslcr_n$ 720 if the differential input voltage received by the comparator 708 is positive. In some examples, the comparator 708 can output 0 V for $vslcr_p$ 718 and 1 V for $vslcr_n$ 720 if the differential input voltage received by the comparator 708 is negative. The differential input voltage can be associated with the difference between $vcdac_p$ and $vcdac_n$.

In response to the SAR logic circuit 710 processing each of the $vslcr_p$ 718, the $vslcr_n$ 720, and the clock value from the Rx Optics and A/D block 600, the SAR logic circuit 710 can output a digital code of size N−1 to 0, where N represents a number of bits of the SAR ADC. The SAR logic circuit 710 can supply the digital code to the RX DSP 650 as shown in FIG. 6. For example, the ADC 702-1 can supply the X-polarization digital code to the RX DSP 650 and the ADC 702-2 can supply the Y-polarization digital code to the RX DSP 650.

Figure 8:
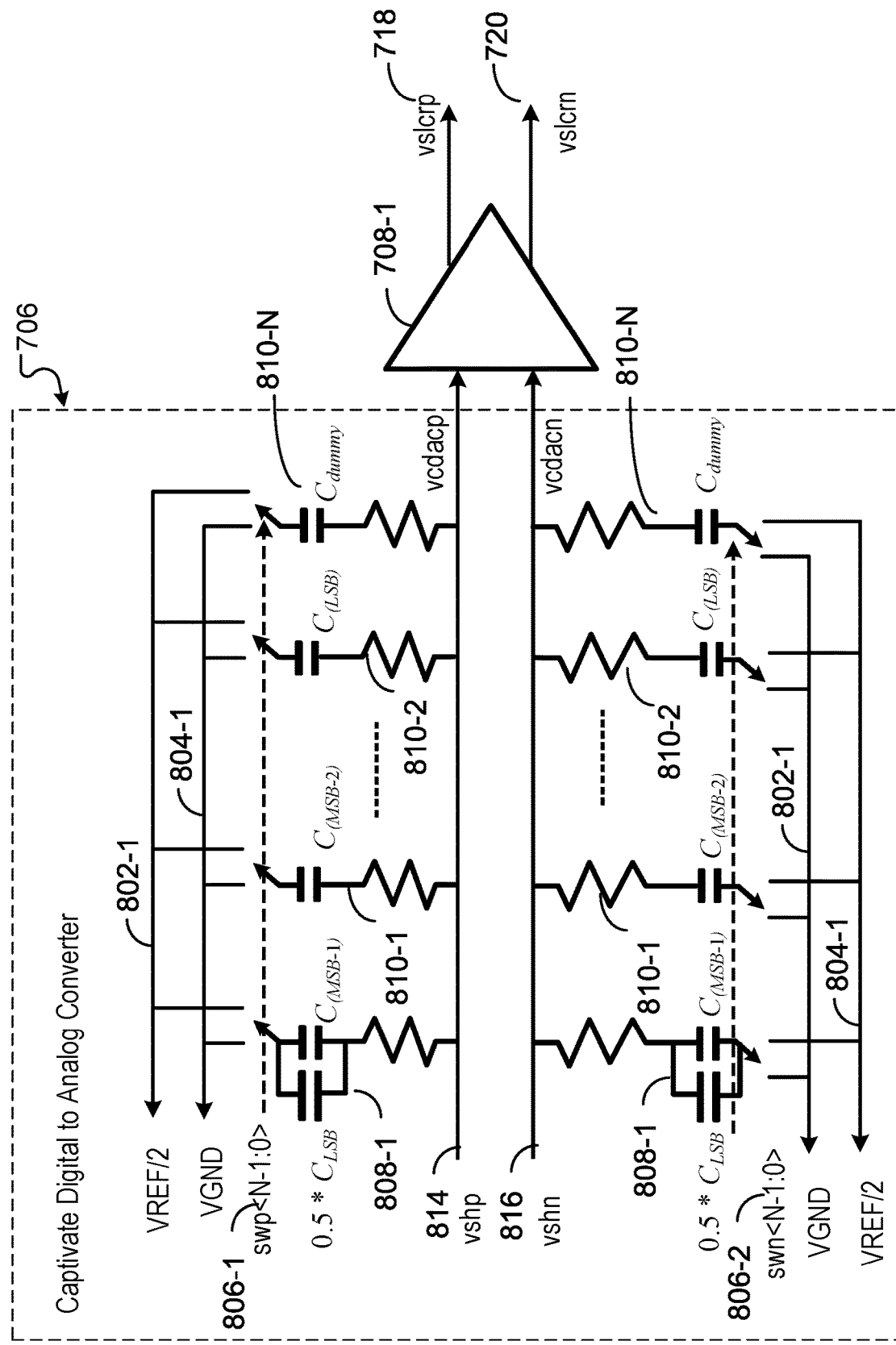
FIG. 8 is a block diagram illustrating components of a Capacitive Digital-to-Analog Converter (CDAC) in the ADC shown in FIG. 7.

FIG. 8 is a block diagram illustrating components of CDAC 706 in the ADC shown in FIG. 7. The CDAC 706 can include various capacitor and resistor components that connect to ground or references according to switch positions set by the SAR logic circuit 710. Additionally, FIG. 8 illustrates how the components of the CDAC 706 connect to the comparator 708-1.

In some implementations, the CDAC 706 can include a capacitive divider circuit with N−1 branches and a dummy branch 810-N on portions of the CDAC 706 processing both the positive voltage ($vsh_p$) and the negative voltage ($vsh_n$). One portion (e.g., the left most branch) of the CDAC 706 can be denoted as the MSB−1 branch 808-1, where MSB represents the most significant bit of the number of bits of the SAR ADC, and another portion (e.g., the right most branch) of the CDAC 706 can be denoted as the LSB branch 810-2, where LSB represents the least significant bit of the number of bits of the SAR ADC. As previously mentioned, the CDAC 706 can utilize a binary search process to search through all possible quantization levels to identify the discrete digital representation of the analog input value.

In the binary search of the CDAC 706, the values of each of the capacitors in the capacitive divider circuit can be represented as binary coefficients multiplied by unit capacitance for an N-bit SAR ADC. The dummy branch 810-N also has a value of unit capacitance. For example, the binary coefficients can be represented as ($2^{N-1}$, $2^{N-2}$, . . . 2), and so on. The binary search process is performed in N steps. For example, based on the comparator 708-1's output in a previous step, each branch's switch in the capacitive divider circuit is turned on, e.g., a branch is connected to line 802-1 having value of $V_{REF}$, such as $V_{REF}/2$ or another value, or off, e.g., a branch is connected to line 804-1 having value of $V_{GND}$, such that a residual error between an approximation and the input voltage is reduced to within LSB of a quantized level. In some cases, the $V_{REF}$ voltage or voltage reference is not grounded.

During an initial $0^{th}$ step of the binary search, each of the switches of the capacitive divider circuit on the positive and negative sides are open and the comparator 708-1 provides an output based on the polarity of the comparator 708-1's differential input, e.g., $vcdac_p - vcdac_p$. At this step, the comparator 708-1 can provide the information of the most significant bit branch. If the differential input is positive, e.g., ($vcdac_p - vcdac_n$)>0, the SAR logic circuit 710-1 can turn on the switch of the MSB−1 branch 808-1 on the negative side of the capacitive divider circuit. If the differential input is negative, e.g., ($vcdac_p - vcdac_n$)<0, the SAR logic circuit 710-1 can turn on the switch of the MSB−1 branch 808-1 on the positive side of the capacitive divider circuit. The SAR logic circuit 710-1 can turn on the switches of the positive side of the capacitive divider circuit by setting a 1 value in the $sw_p$ values 806-1 for the switches desired to be turned on. Similarly, the SAR logic circuit 710-1 can turn on the switches of the negative side of the capacitive divider circuit by setting a 1 value in the $sw_n$ values 806-2 for the switches desired to be turned on.

By turning on the switch of the MSB−1 branch 808-1 on the positive or negative side of the capacitive divider circuit, the CDAC 706 can add or subtract, respectively, a value equivalent to half of the voltage value used on 802-1 or 804-1, such as $V_{REF}/2$, from the input voltage, e.g., $vsh_p$ 814 or $vsh_n$ 816. For example, if the switch of the MSB−1 branch 808-1 on the positive side of the capacitive divider circuit is turned on, a value equivalent to half of $V_{REF}/2$ is added to the input voltage $vsh_p$ 814. Similarly, if the switch of the MSB−1 branch 808-1 on the negative side of the capacitive divider circuit is turned off, a value equivalent to half of the voltage value used on 804-1, such as $V_{REF}/2$, is subtracted from the input voltage $vsh_n$ 816. In response, the updated residual voltage is provided to the comparator 708-1 and the comparator 708-1 provides the polarity of the updated residual voltage to the SAR logic circuit 710-1. If the comparator 706-1's output voltage is positive, then the SAR logic circuit 710 turns on the switch of the MSB-2 capacitor 810-1 on the negative side of the capacitive divider circuit. Otherwise, if the comparator 706-1's output voltage is negative, then the SAR logic circuit 710 turns on the switch of the MSB-2 capacitor 810-1 on the positive side of the capacitive divider circuit.

By turning on the switch of the MSB-2 capacitor 810-1 of the positive or negative side of the capacitive divider circuit, the CDAC 706 can add or subtract a quarter or ¼ of the voltage on line 802-1 or 804-1, such as $V_{REF}/2$, from the residual voltage depending on the output of the comparator 708-1 from the previous step. More specifically, the CDAC 706 can add a quarter of the voltage on line 802-1 or 804-1, such as $V_{REF}/2$, to the residual voltage if the comparator 708-1 from the previous step is negative and the CDAC 706 can subtract a quarter of the voltage on line 802-1 or 804-1, such as $V_{REF}/2$, from the residual voltage if the comparator 708-1 from the previous step is positive. At every step i of the binary search process, $1/2^i$ of the voltage on line 802-1 and 804-1, such as $V_{REF}/2$, is added or subtracted from the residual voltage based on the output of the comparator 708-1 in the previous step for i=1, 2, . . . N−1 for the case of an N-bit SAR ADC. The binary search process repeats until the process reaches the switch of the LSB branch 810-2 in the capacitor divider circuit. The comparator 708-1's output at each step can provide information indicative of the digital codeword.

In some implementations, the comparator 708-1 can provide its output to the SAR logic circuit 710. Specifically, the comparator 708-1 can provide the output of $vslcr_p$ 718 and $vslcr_n$ 720 to the SAR logic circuit 710. The SAR logic circuit 710 can obtain the $vslcr_p$ 718 and $vslcr_n$ 720 information output by the comparator 708-1 and provide switches values, e.g., $sw_p$ 806-1 and $sw_n$ 806-2, to control the switches of the positive and negative sides of the capacitive divider circuit. Additionally, the SAR logic circuit 710 can process the outputs from the comparator 708-1 to determine the digital code word following the binary search process.

As will be further described below, a symmetric nature of the CDAC 706-1 switching over a polarity of input voltages can cause a quantization error of the SAR ADC to be between −1 LSB to 0 for the analog input signal ranging between 0 and the negative full scale of values. Similarly, the quantization error of the SAR ADC can be between 0 and +1 LSB for input signal ranges between 0 and the positive full scale of values. On the other hand, the generic ADC operation has a quantization error that ranges from −0.5 LSB to +0.5 LSB. The quantization error profile of the SAR ADC compared to the quantization error profile of the generic ADC operation has a higher noise power, and thus, a degradation in SQNR of roughly 2 dB can be introduced in the SAR ADC.

In order to mitigate such degradation in SQNR in the SAR ADC, an intentional polarity dependent offset can be applied to the CDAC 706 to the input voltage or decision levels to ensure the quantization error to be always between −LSB/2 and LSB/2 regardless of the input voltage provided to the SAR ADC. This reduction in SQNR can be achieved by adding an offset of +0.5 LSB if the input is between 0 and the positive full scale of values while adding an offset of −0.5 LSB if the input is between 0 and the negative full scale of values. Note, the intentionally added offset can be applied to either the input signal or the decision level, and its polarity is dependent on the implementation details and circuit topologies.

As illustrated in FIG. 8, the polarization dependent offset can be implemented together with the MSB branch operation of the CDAC 706. Specifically, from the first step of the binary search process of the SAR ADC 702-1 where the MSB branch is determined, the input polarization is detected by the comparator 708 and stored in the SAR logic circuit 710. This polarity dependent offset is passed onto the MSB capacitor in either the positive or negative side of the CDAC 706. FIG. 8 illustrates increasing a capacitance value by half of the unit capacitor or by adding a 0.5 $C_{LSB}$ in parallel with the $C_{MSB-1}$ to increase the overall capacitance in the MSB branch 808-1. Compared to the conventional scheme, the overall quantization error profile can be successfully shifted up or down by 0.5 LSB depending on the polarity of the input voltage value.

By increasing the value of the MSB capacitor by half of the unit capacitor in the SAR ADC 702-1, the quantization error profile can be confined with −0.5 LSB to +0.5 LSB. As such, the SQNR performance can therefore be restored to the theoretical limit defined by equation 1. The visualization of the improved SQNR performance is illustrated and described with respect to FIG. 12 below.

Figure 9:
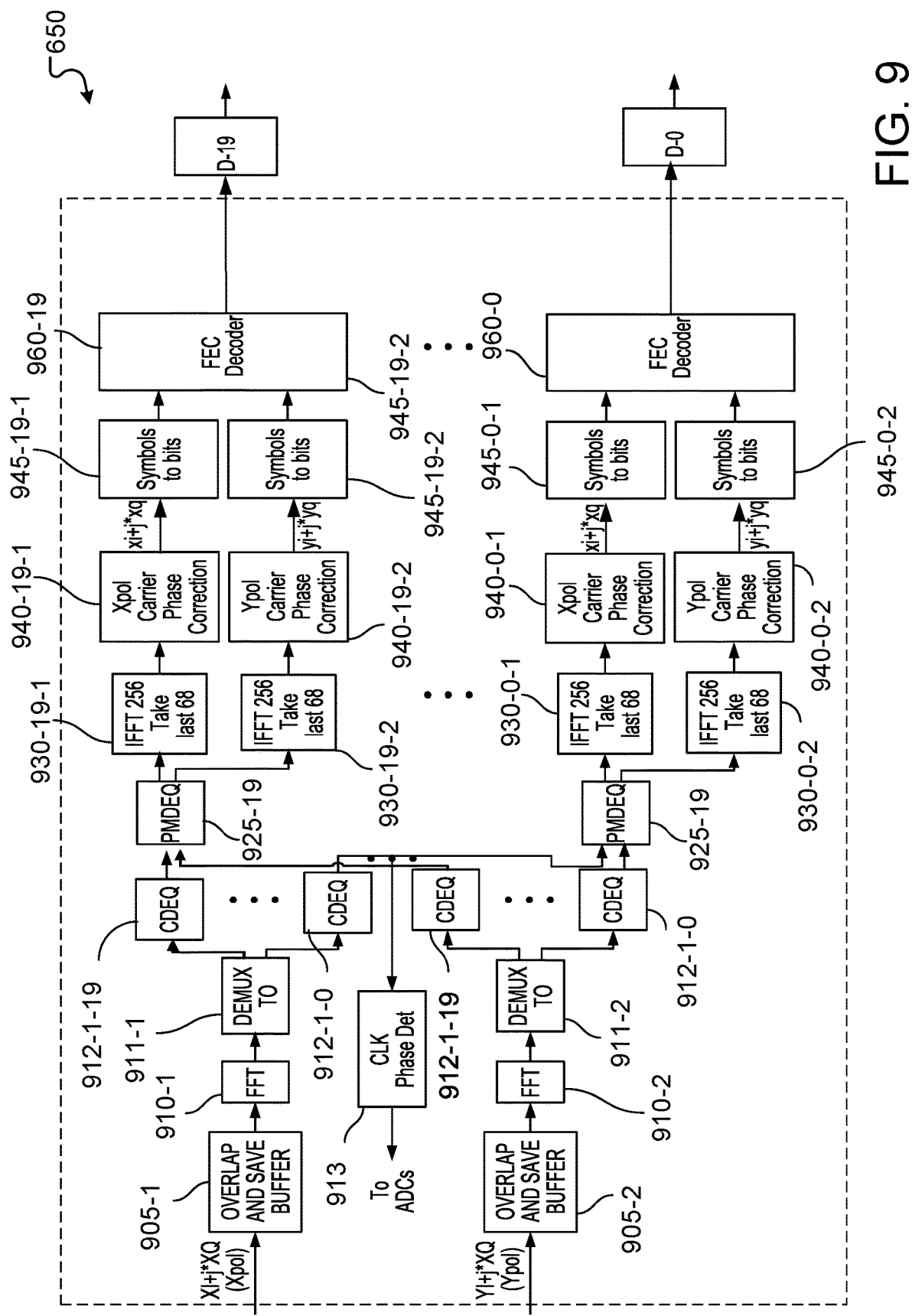
FIG. 9 is a block diagram illustrating an example digital signal processor of the receiver shown in FIG. 6.

FIG. 9 illustrates exemplary components of the Rx DSP 650. As noted above, analog-to-digital (A/D) circuits 640-1 and 640-2 (FIG. 6) output digital samples corresponding to the analog inputs supplied thereto. In one example, the samples can be supplied by each A/D circuit at a rate of 64 GSamples/s. The digital samples may correspond to symbols carried by the X polarization of the optical subcarriers and can be represented by the complex number XI+jXQ. The digital samples can be provided to overlap and save buffer 905-1, as shown in FIG. 9. FFT component or circuit 910-1 can receive the 2048 vector elements from the overlap and save buffer 905-1 and convert the vector elements to the frequency domain using, for example, a fast Fourier transform (FFT). The FFT component 910-1 can convert the 2048 vector elements to 2048 frequency components, each of which can be stored in a register or "bin" or other memory, as a result of carrying out the FFT.

Demultiplexer 911-1 can demultiplex the frequency components, and groups of such components can be supplied to a respective one of chromatic dispersion equalizer circuits (CDEQ) 912-1-0 to 912-1-19, each of which can include a finite impulse response (FIR) filter that corrects, offsets or reduces the effects of, or errors associated with, chromatic dispersion of the transmitted optical subcarriers. Each of CDEQ circuits 912-1-0 to 912-1-19 supplies an output to a corresponding polarization mode dispersion (PMD) equalizer circuit 925-0 to 925-19 (which individually or collectively can be referred to as 925). Without loss of generality, PMD equalization can be done in frequency domain or in time domain after IFFT 930 and before carrier phase correction 940.

Digital samples output from A/D circuits 640-2 associated with Y polarization components of subcarrier SC1 can be processed in a similar manner to that of digital samples output from A/D circuits 640-1 and associated with the X polarization component of each subcarrier. Namely, overlap and save buffer 905-2, FFT 910-2, demultiplexer 911-2, and CDEQ circuits 912-2-0 to 912-2-19 can have a similar structure and operate in a similar fashion as buffer 905-1, FFT 910-1, demultiplexer 911-1, and CDEQ circuits 912-1-0 to 912-1-19, respectively. For example, each of CDEQ circuits 912-2-0 to 912-19 can include an FIR filter that corrects, offsets, or reduces the effects of, or errors associated with, chromatic dispersion of the transmitted optical subcarriers. In addition, each of CDEQ circuits 912-2-0 to 912-2-19 provides an output to a corresponding one of PMDEQ 925-0 to 925-19.

As further shown in FIG. 9, the output of one of the CDEQ circuits, such as CDEQ 912-1-0 can be supplied to clock phase detector circuit 913 to determine a clock phase or clock timing associated with the received subcarriers. Such phase or timing information or data can be supplied to ADCs 640-1 and 640-2 to adjust or control the timing of the digital samples output from ADCs 640-1 and 640-2.

Each of PMDEQ circuits 925 can include another FIR filter that corrects, offsets or reduces the effects of, or errors associated with, PMD of the transmitted optical subcarriers. Each of PMDEQ circuits 925 can supply a first output to a respective one of IFFT components or circuits 930-0-1 to 930-19-1 and a second output to a respective one of IFFT components or circuits 930-0-2 to 930-19-2, each of which can convert a 256-element vector, in this example, back to the time domain as 256 samples in accordance with, for example, an inverse fast Fourier transform (IFFT).

Time domain signals or data output from IFFT 930-0-1 to 930-19-1 are supplied to a corresponding one of Xpol carrier phase correction circuits 940-0-1 to 940-19-1, which can apply carrier recovery techniques to compensate for X polarization transmitter (e.g., laser 408) and receiver (e.g., local oscillator laser 610) linewidths. In some implementations, each carrier phase correction circuit 940-0-1 to 940-19-1 can compensate or correct for frequency and/or phase differences between the X polarization of the transmit signal and the X polarization of light from the local oscillator 530 based on an output of Xpol carrier recovery circuits 940-0-1 to 940-19-1, which performs carrier recovery in connection with one of the subcarrier based on the outputs of IFFTs 930-0-1 to 930-19-1. After such X polarization carrier phase correction, the data associated with the X polarization component can be represented as symbols having the complex representation $xi+j*xq$ in a constellation, such as a QPSK constellation or a constellation associated with another modulation formation, such as an m-quadrature amplitude modulation (QAM), m being an integer. In some implementations, the taps of the FIR filter included in one or more of PMDEQ circuits 925 can be updated based on the output of at least one of carrier phase correction circuits 940-0-1 to 940-19-01.

In a similar manner, time domain signals or data output from IFFT 930-0-2 to 930-19-2 are supplied to a corresponding one of Ypol carrier phase correction circuits 940-0-2 to 940-19-2, which can compensate or correct for Y polarization transmitter (e.g., laser 408) and receiver (e.g., local oscillator laser 610) linewidths. In some implementations, each carrier phase correction circuit 940-0-2 to 940-19-2 also can correct or compensate for frequency and/or phase differences between the Y polarization of the transmit signal and the Y polarization of light from the local oscillator 530. After such Y polarization carrier phase correction, the data associated with the Y polarization component can be represented as symbols having the complex representation $yi+j*yq$ in a constellation, such as a QPSK constellation or a constellation associated with another modulation formation, such as an m-quadrature amplitude modulation (QAM), m being an integer. In some implementations, the output of one of circuits 940-0-2 to 940-19-2 can be used to update the taps of the FIR filter included in one or more of PMDEQ circuits 925 instead of, or in addition to, the output of at least one of the carrier recovery circuits 940-0-1 to 940-19-1.

The equalizer, carrier recovery, and clock recovery can be further enhanced by utilizing the known (training) bits that can be included in control signals CNT, for example by providing an absolute phase reference between the transmitted and local oscillator lasers.

Each of the symbols-to-bits circuits or components 945-0-1 to 945-19-1 can receive the symbols output from a corresponding one of circuits 940-0-1 to 940-19-1 and map the symbols back to bits. For example, each of the symbol-to-bits components 945-0-1 to 945-19-1 can demap one X polarization symbol, in a QPSK or m-QAM constellation, to Z bits, where Z is an integer. For dual-polarization QPSK modulated subcarriers, Z is two. Bits output from each of component 945-0-1 to 945-19-1 are provided to a corresponding one of FEC decoder circuits 960-0 to 960-19.

Y polarization symbols are output form a respective one of circuits 940-0-2 to 940-19-2, each of which has the complex representation $yi+j*yq$ associated with data carried by the Y polarization component. Each Y polarization, like the X polarization symbols noted above, can be provided to a corresponding one of symbols-to-bits circuits or components (demappers) 945-0-2 to 945-19-2, each of which has a similar structure and operates in a similar manner as symbols-to-bits component 945-0-1 to 945-19-1. Each of circuits 945-0-2 to 945-19-2 can provide an output to a corresponding one of FEC decoder circuits 960-0 to 960-19.

Each of FEC decoder circuits 960 can remove errors in the outputs of symbol-to-bit circuits 945 using, for example, forward error correction. Such error corrected bits, which can include user data for output, can be supplied to a corresponding one of switch circuits SW-0 to SW-19. As noted above, switch circuits SW-0 to SW-19 in each leaf node 104a, 104b, 104c, 104d can selectively supply or block data based on whether such data is intended to be output at the leaf node. In addition, if one of the received subcarriers' control information (CNT), such as information identifying switches SW that output data and other switches SW that block data, the control information can be output from one of the switches and, based on such control information, control circuit 671 in the leaf nodes to generate the control signals CNT.

Consistent with another aspect of the present disclosure, data can be blocked from output from Rx DSP 650 without the use of switches SW-0 to SW-19. In one example similar to an example described above, zero (0) or other predetermined values can be stored in frequency bins associated with the blocked data, as well as the subcarrier corresponding to the blocked data. Further processing described above of such zeroes or predetermined data by circuitry in Rx DSP 650 can result in null or zero data outputs, for example, from a corresponding one of FEC decoders 960. Switch circuits provided at the outputs of FFTs 910-1 and 910-2, like switch circuits SW described above in FIG. 5, can be provided to selectively insert zeroes or predetermined values for selectively blocking corresponding output data from RX DSP 650. Such switches also can be provided at the output of or within demultiplexers 911-1 and 911-2 to selectively supply zero or predetermined values.

In another example, zeroes (Os) can be inserted in chromatic dispersion equalizer (CDEQ) circuits 912 associated with both the X and Y polarization components of each subcarrier. In particular, multiplier circuits (provided in corresponding butterfly filter circuits), like multiplier circuits M described above, can selectively multiply the inputs to the CDEQ circuit 912 by either zero or a desired coefficient. Multiplication by a zero generates a zero product. When such zero products are further processed by corresponding circuitry in RX DSP 650, e.g., corresponding IFFTs 930, carrier phase correction components 940, symbol-to-bits components 945, and FEC decoder 960, a corresponding output of RX DSP 650 will also be zero. Accordingly, data associated with a subcarrier SC received by a leaf node receiver, but not intended for output from that receiver, can be blocked.

If, on the other hand, capacity requirements change and such previously blocked data is to be output from a given leaf node receiver DSP (e.g., RX DSP 650), appropriately coefficients can be supplied to the multiplier circuits, such that at least some of the inputs thereto are not multiplied by zero. Upon further processing, as noted above, data associated with the inputs to the multiplier circuits and corresponding to a particular subcarrier SC is output from leaf node receiver DSP (e.g., RX DSP 650).

While FIG. 9 shows RX DSP 650 as including a particular number and arrangement of functional components, in some implementations, RX DSP 650 can include additional functional components, fewer functional components, different functional components, or differently arranged functional components.

Referring back to FIG. 1, in some implementations, a network node can transmit data by generating optical signals that are modulated according to one or more optical subcarriers that are associated with the intended destination or destinations of the data. For example, the hub node 102 can receive data packets (e.g., from the hub node 102 itself and/or from another network node or user device), ascertain the intended destination of each of the data packets, and identify one or more respective optical subcarriers that can be used to transmit data to each of those destinations. Based on this information, the hub node 102 can generate one or more optical signals (e.g., using one or more light emitters, such as laser emitters), modulate the optical signals according to the identified optical subcarriers (e.g., using one or more local oscillators, multiplexers, etc.), and transmit the modulated optical signals over one or more optical links to each of the intended destinations (e.g., one or more of the leaf nodes 104-104*n*).

The hub node 102 includes several components including a hub transceiver 112 that can generate one or more optical signals, and transmit the optical signals (e.g., via one or more egress network interfaces) to the optical communications network 108. For example, hub transceiver 112 can generate an optical signal that is modulated according to multiple sets of optical subcarriers (e.g., SC Groups 1-4), where each set of optical subcarriers is associated with a different one of the leaf nodes 104*a*-104*n*. In some implementations, the hub transceiver 112 can provide the optical signal to the splitter/combiner, which splits the optical signal into several power-divided instances of the optical signal. Each of the power-divided instances of the optical signal can be transmitted to a respective one of the leaf nodes 104*a*-104*n* (e.g., via an optical link 106).

In some implementations, at least some of the ingress network interfaces can include an Ethernet interface, an OTN interface, and/or a Serializer/Deserializer (SerDes) interface. Further, at least some of the egress network interfaces can include a SerDes interface.

Each of the leaf nodes 104*a*-104*n* can receive a respective instance of the optical signal, and selectively demodulate that instance of the optical signal according to the set of optical subcarriers to which it is assigned (e.g., to recover the data that is intended for it). Further, each of the leaf nodes 104*a*-104*n* can selectively filter, block, or otherwise not demodulate the respective optical signal according to the sets of optical subcarriers to which it is not assigned (e.g., such that it refrains from recovering the data that is not intended for it).

Figure 2:
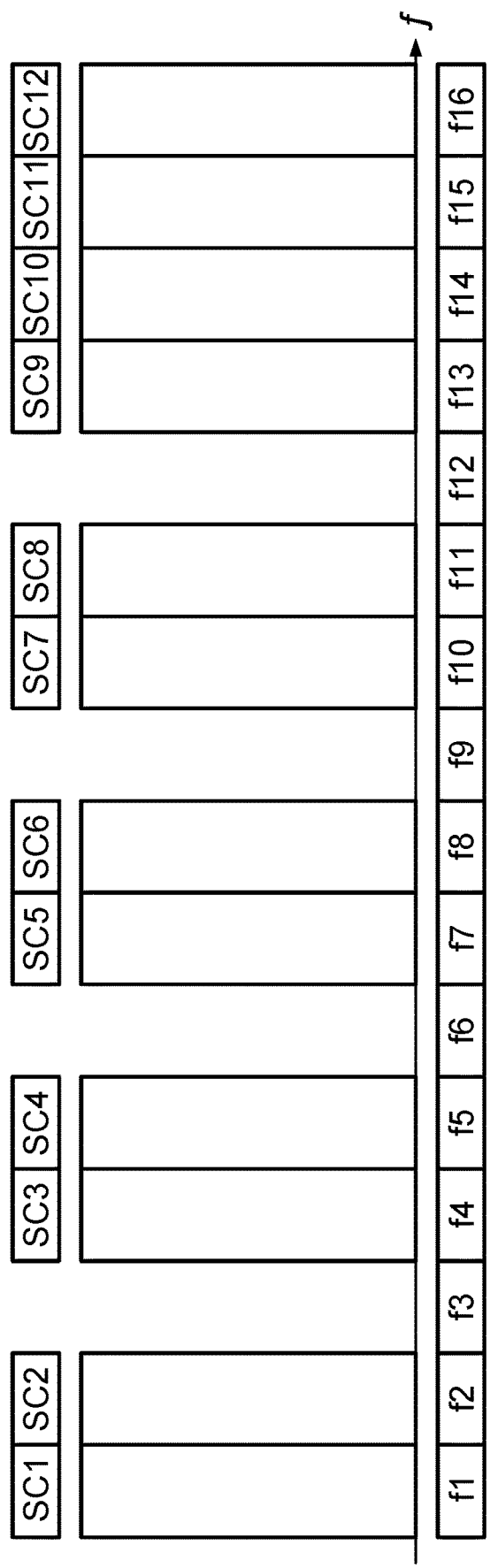
FIG. 2 is a diagram of optical subcarriers depicted over a frequency domain spectrum.

FIG. 2 shows example sets of optical subcarriers SC1-SC16 that may be made available for use by the hub node 102 and the leaf nodes 104*a*-104*n*. In this example, the optical subcarriers SC1-SC16 (corresponding to frequencies f1-f16) are available for exchanging data between the hub node 102 and the leaf nodes 104*a*-104*n*. Further, each of the optical subcarriers SC1-SC16 are spectrally contiguous with respect to the frequency domain (e.g., the frequencies f1-f16 define a continuous range of frequencies).

In an example configuration, the hub node 102 and the leaf node 104*a* can be assigned the optical subcarrier SC1 for exchanging data between them. Further, the hub node 102 and the leaf node 104*b* can be assigned the optical subcarrier SC2 for exchanging data between them. Further still, the hub node 102 and the leaf node 104*c* can be assigned the optical subcarrier SC3 for exchanging data between them. The other optical subcarriers can be assigned in a similar manner to facilitate the exchange of data between other pairings of the hub node 102 and the leaf nodes.

In some implementations, a single optical subcarrier can be allocated to transmit data between two respective network nodes. In some implementations, multiple optical subcarriers (e.g., two, three, four, or more) can be allocated to transmit data between two respective network nodes.

In some implementations, at least some of the subcarriers described herein can be Nyquist subcarriers. A Nyquist subcarrier is a group of optical signals, each carrying data, where (i) the spectrum of each such optical signal within the group is sufficiently non-overlapping such that the optical signals remain distinguishable from each other in the frequency domain, and (ii) such group of optical signals is generated by modulation of light from a single laser. In general, each subcarrier may have an optical spectral bandwidth that is at least equal to the Nyquist frequency, as determined by the baud rate of such subcarrier.

Although FIG. 2 shows an example configuration of twelve optical subcarriers, FIG. 2 is merely an illustrative example. In general, various number of optical subcarriers can be used by the network nodes 102 and 104*a*-104*n* to exchange data. Further, some, none, or all of optical subcarriers can be spectrally contiguous with one another with respect to the frequency domain. Further, some, none, or all of optical subcarriers can be spectrally separated from one another with respect to the frequency domain (e.g., such that one or more guard bands are positioned spectrally between adjacent optical subcarriers in the frequency domain).

In some implementations, the hub node 102 and/or the leaf nodes 104*a*-104*n* can include or be connected to pluggable devices that are configured to enhance the functionality of the network nodes 102 and 104a-104n. For example, at least some of the hub transceiver 112 and/or the leaf transceiver 114a-114n can include a physical communications interface (e.g., a plug or socket) that is configured to reversibly insert into and/or receive corresponding physical communications interface of a network node 102 or 104a-104n, and exchange information with that network node to facilitate network operations and performance.

Figure 3:
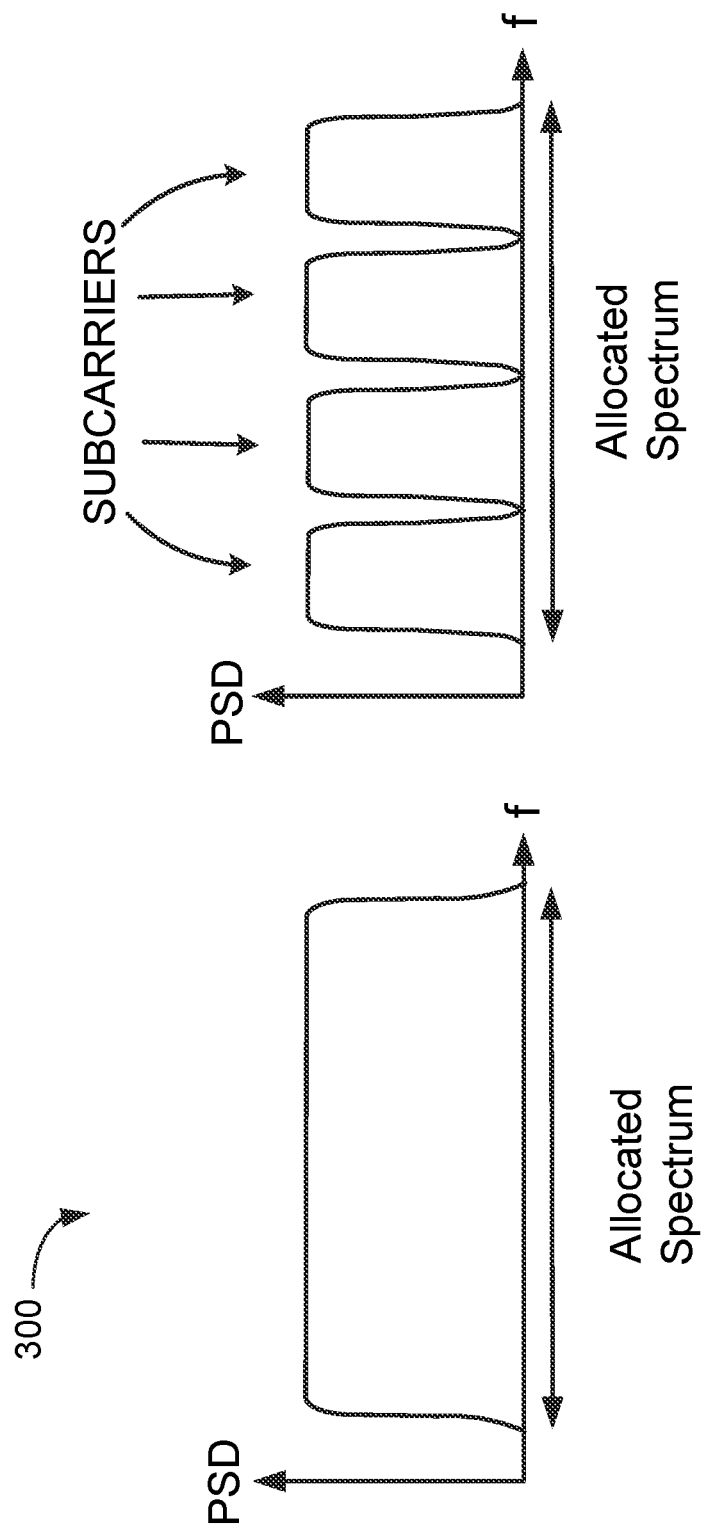
FIG. 3A is a diagram of a single optical carrier.
FIG. 3B is a diagram showing a channel with multiple subcarriers.

FIG. 3A and FIG. 3B are diagrams of optical subcarriers depicted over various frequency domain spectrums. In an optical communication system, a certain bandwidth, or spectrum, may be allocated to an optical communications channel. As shown in FIG. 3A, the channel may include a single carrier. In the implementation of FIG. 3A, data may be mapped to a pulse of a desired spectral shape. In the implementation of FIG. 3A, the pulse may be designed to fill the entire spectrum.

A system and method, as described herein, may use digital-to-analog converters to generate multiple subcarriers. As shown in FIG. 3B, rather than including a single carrier, the channel may include multiple subcarriers. The quantity of subcarriers may be a design decision that may be based on properties of the laser and/or other optical components being used. In the implementation of FIG. 3B, data may be mapped to a respective one of the multiple subcarriers. As described in further detail below, each subcarrier may be independently generated and processed by the same transmitter.

The use of high-speed DACs and ADCs (e.g., 64 GSample/s and beyond) may reduce the computational complexity of both the transmitter and the receiver. The high speed DACs and ADCs may facilitate the tuning of the output signal given design characteristics of the lasers and the modulators, and the available power budget. According to some implementations, a transmitter may be designed with a DSP, DACs, and electro-optical conversion (e.g., a laser and a modulator), and a receiver may be designed with receiver optics (e.g., a hybrid mixer and a local oscillator), ADCs, and a DSP. Such a transmitter may generate one or more subcarriers, and such a receiver may detect the one or more subcarriers. For example, if 32 GHz of optical spectrum is available for a channel, then the transmitter might generate one subcarrier of 32 Gbaud, two subcarriers of 16 Gbaud, three subcarriers of 10.66 Gbaud, and so on. The subcarriers may be designed so that the subcarriers can be substantially encoded and decoded separately.

The use of multiple subcarriers may provide several advantages. For example, digital filters, for the multiple subcarrier approach, may include fewer taps than existing approaches. For equal dispersion, a higher baud rate requires more taps than a lower baud rate. For example, a 40 Gbaud system may need approximately 2800 baud of taps, while a 10 Gbaud system may need approximately 180 baud of taps for 200,000 picoseconds per nanometer (ps/nm). The multiple subcarrier approach may reduce the penalty due to the combination of a receiver laser linewidth and electronic dispersion compensation because of the flexibility in choosing the baud rate of the subcarriers. The multiple subcarrier approach may also permit bit error rate (BER) averaging over the subcarriers, which can lead to performance benefits. The multiple subcarrier approach may also reduce power consumption over existing approaches.

Figure 10:
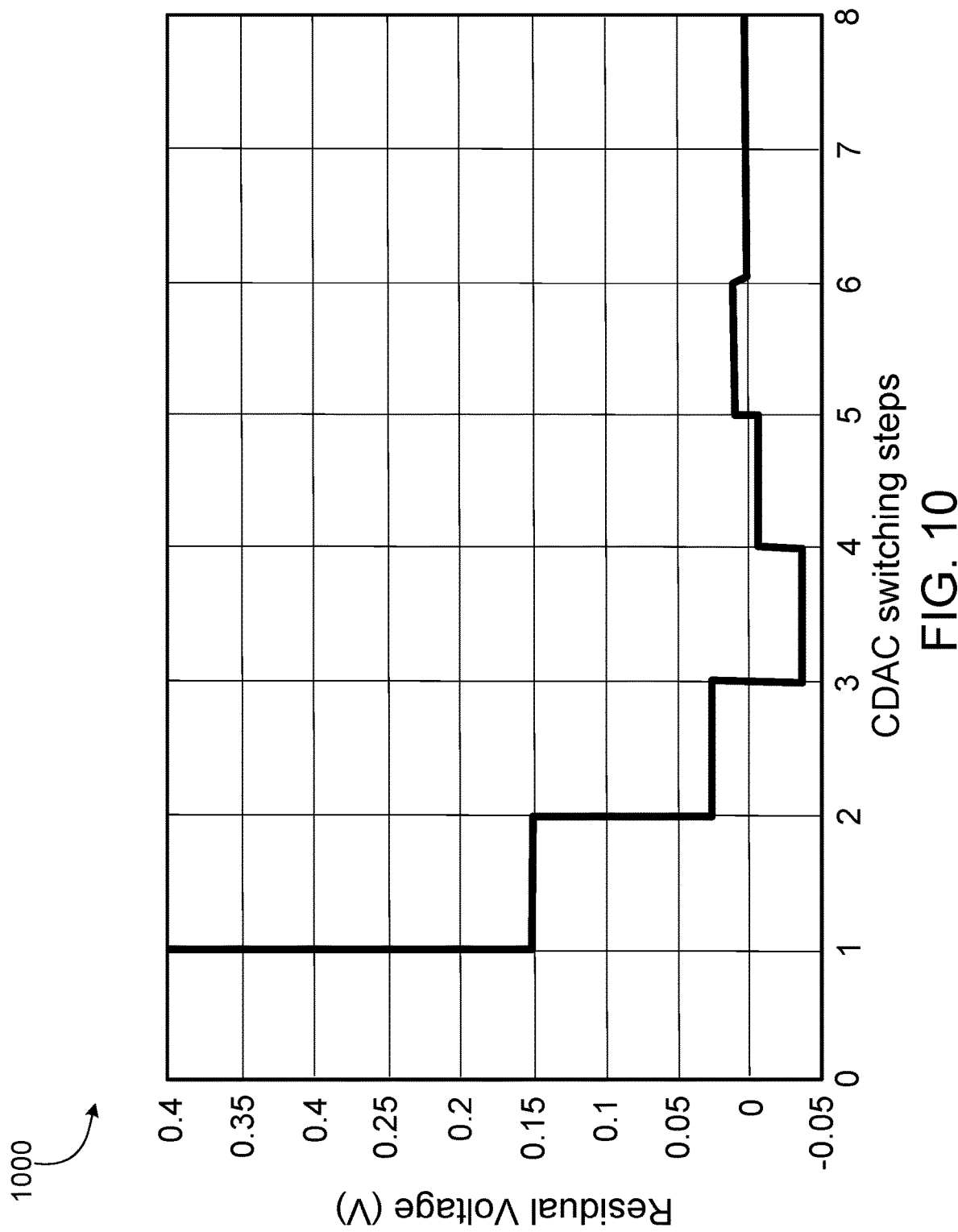
FIG. 10 is an example graph illustrating differential residual error at an output of the CDAC.

FIG. 10 is an example graph 1000 illustrating differential residual error at an output of a CDAC, such as CDAC 706 from FIG. 7. Specifically, the graph 1000 illustrates the differential residual voltage that is a difference of positive outputs and negative outputs of the CDAC 706. For example, the differential residual voltage can be represented as the difference between $vcdac_p$ and $vcdac_n$, which is provided to the comparator 708-1. The graph 1000 demonstrates how the residual voltage changes at each step of the binary search process. Each step of the binary search process can be associated with the SAR logic circuit, such as SAR logic circuit 710 outputting a new switch value to the CDAC 706

In some examples, the input voltage can be 0.4 V, $V_{REF}$=1 V, and the codeword can be represented as a 7-bit codeword. As explained earlier, initially the residual voltage is 0.4 V when all the switches on the positive and negative sides of the CDAC 706 are turned off, i.e., branch connected to $V_{GND}$. In response, the positive and negative output of the comparator 708, e.g., $vslcr_p$ 718 and $vslcr_n$ 720, can then be set to 1 V and 0 V, respectively. These outputs are then provided to the SAR logic circuit 710. In response, the SAR logic circuit 710 can generate switches values, e.g., $sw_p$ and $sw_n$, which turns on the negative MSB−1 branch 808-1 of the CDAC 706 and the residual voltage is then reduced to 0.15, e.g., 0.4 V−0.25 V. Repeating the process, the positive and negative sides of the comparator 708 are output as 1 V and 0 V, e.g., $vslcr_p$ 718 and $vslcr_n$ 720, and the SAR logic circuit 710 can turn on the negative switch of the MSB−2 capacitor 810-1 of the CDAC 706. In the next step, the residual voltage becomes 0.025 V, .e.g., 0.15−0.125 V, and the process continues to the next branch in the CDAC 706. The residual values can be seen in the graph 1000 and the process repeats for each of the CDAC 706's switching steps. For example, the residual voltage values can be 0.4 V, 0.15 V, 0.025 V, and so on.

The quantization levels defined by the ADCs 640-1 can be represented as $V_i$, where i is between 0 and $2^{n-1}$. If the input voltage provided to the ADC is positive, each of the input voltages between $V_i$ and $V_{i+1}$ can be mapped to the quantization level $V_i$. If the input voltage provided to the ADC is negative, each of the input voltages between $V_i$ and $V_{i+1}$ can be mapped to the quantization level $V_{i+i}$. In some examples, by applying the CDAC switching mechanism, the quantization error of a 7-bit SAR ADC with $V_{REF}$=1 V peak-to-peak for the input range, e.g., −500 millivolts (mV) to 500 mV, can be illustrated. In this example, the LSB can be represented by 7.8125 mV. As such, the quantization error for this SAR ADC can vary between 0 and 7.8125 mV for positive input voltages and the quantization error can vary between −7.8125 mV and 0 for negative input voltages. If the quantization error is uniformly distributed between −LSB/2 and LSB/2, the ideal or theoretical SQNR in dB with the presence of quantization noise only is provided in the equation below:

$$SQNR_{ideal}=6.02*N+1.76 \quad (1)$$

In equation 1 above, N represents the number of bits utilized in the SAR ADC. Based on the above equation, the $SQNR_{ideal}$ is 43.9 dB for a 7-bit SAR ADC when only quantization noise is present and all other noise sources or impairments are not present in the SAR ADC system. Due to symmetry in the CDAC switching mechanism over the polarity of input voltages, the quantization error is not uniformly distributed between −LSB/2 to LSB/2, which degrades around 2 dB of SQNR for the 7-bit SAR ADC.

Figure 11:
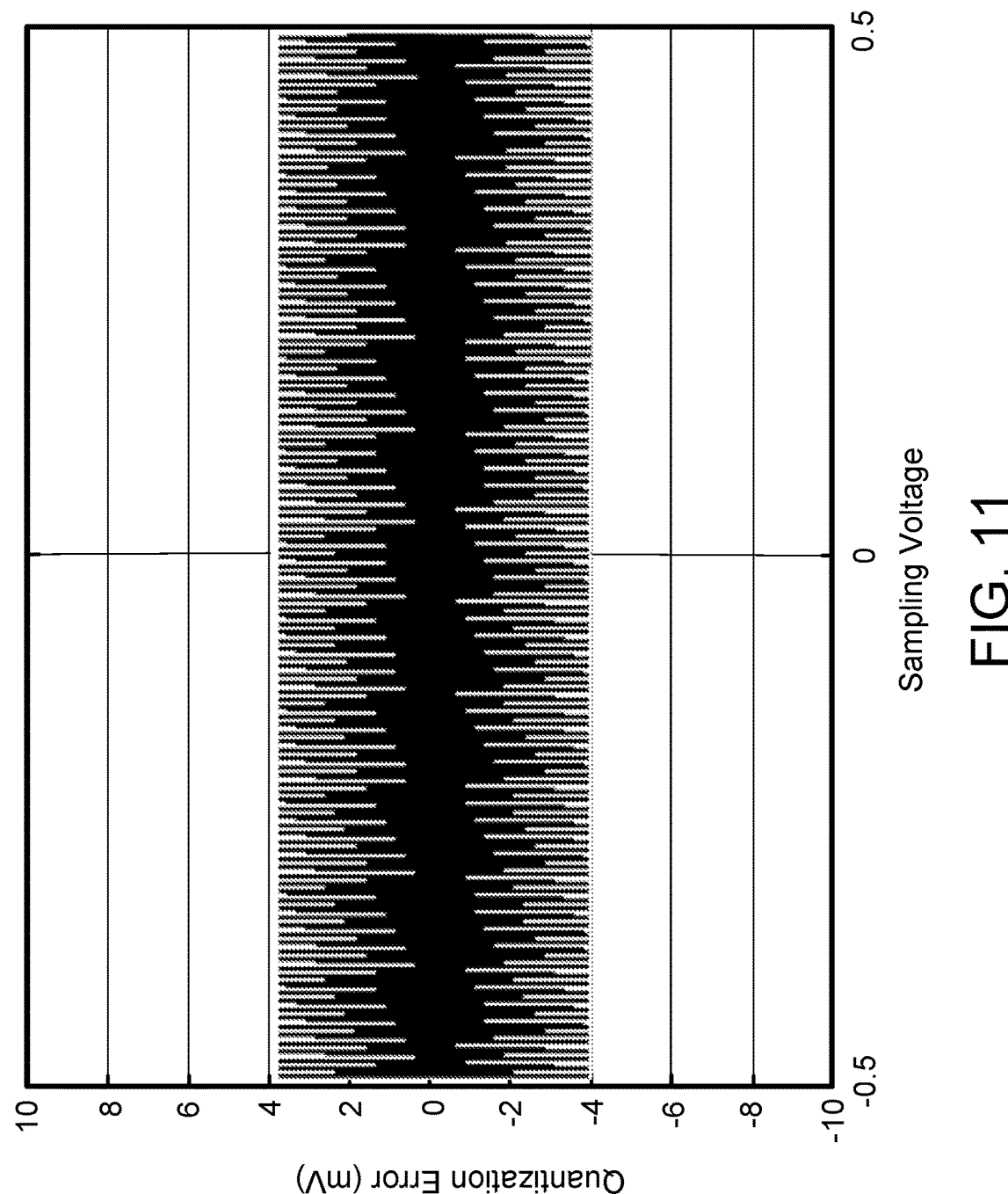
FIG. 11 is an example graph illustrating quantization error of a Successive Approximation Register (SAR) ADC with polarity dependent offset in CDAC switching mechanism.

FIG. 11 is an example graph 1100 illustrating quantization error of a Successive Approximation Register (SAR) ADC with polarity dependent offset in CDAC switching mechanism. By adding a 0.5 times the unit capacitance on the MSB branch of the CDAC, the quantization error of the CDAC can be uniformly distributed between −LSB/2 to LSB/2 across positive and negative sampling voltages. If the LSB value is equivalent to 7.8125 mV, then the –LSB/2 to LSB2 quantization error ranges from –3.90625 mV to 3.90625 mV, which matches to the quantization error illustrated in graph 1100.

Figure 12:
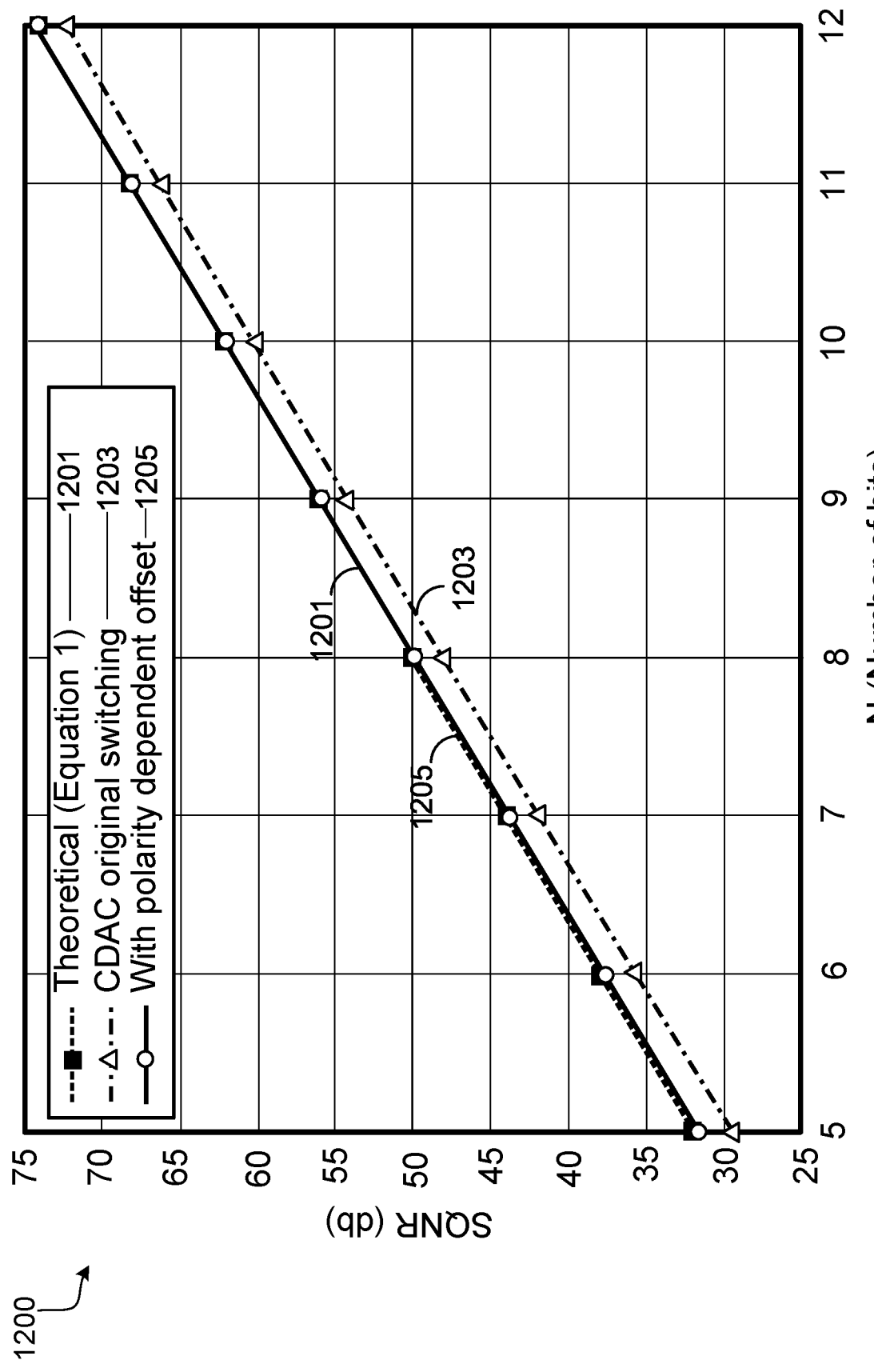
FIG. 12 is an example graph illustrating a number of bits versus signal quantization noise ratio (SQNR) with various switching mechanisms.

FIG. 12 is an example graph 1200 illustrating a number of bits utilized in the SAR ADC versus signal quantization noise ratio (SQNR) with various switching mechanisms. The graph 1200 illustrates a theoretical plot 1201, a CDAC original switching plot 1203, and a polarity dependent CDAC switching plot 1205. The graph 1200 illustrates a significant degradation in SQNR between the theoretical plot 1201, which is based on equation 1 above, and the CDAC original switching plot 1203. For high-speed applications, non-idealities, or impairments, such as sampler or comparator noise, offsets, capacitive mismatches, and metastability errors, can be present in the system. Such non-idealities can further degrade the SQNR and the performance of the SAR ADC. To compensate for these non-idealities, the CDAC can utilize and apply a polarity dependent offset to reduce the quantization error and improve the overall SQNR. By utilizing the polarity dependent offset, such as a value of 0.5 V, the system can more closely achieve the theoretical SQNR in the presence of quantization noise alone, such as shown in the polarity dependent CDAC switching plot 1205.

In graph 1200, the polarity dependent CDAC switching plot 1205 is demonstrated for a 7-bit SAR ADC with a quantization error between –LSB/2 to +LSB/2, where the LSB value is equivalent to 7.8125 mV. With the polarity dependent offset of –LSB/2 to +LSB/2, the input voltage is thus quantized to a nearest quantization level and the quantization error is provided between –LSB/2 to +LSB/2. The graph 1200 illustrates that by using the polarity dependent CDAC switching mechanism, the polarity dependent CDAC switching plot 1205 can achieve a theoretical SQNR limit by overcoming an inherent symmetric nature of the SAR ADC.

While this specification contains many specific implementation details, these should not be construed as limitations on the scope of any disclosure or of what may be claimed, but rather as descriptions of features that may be specific to particular implementations of particular disclosures. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. An apparatus, comprising:
one or more analog-to-digital converts (ADCs), each generate, using the set of voltage signals, digital representations of signals, each ADC comprising:
a sample and hold circuit configured to sample the received set of voltages and hold the sample for a period of time;
a capacitive digital-to-analog converter (CDAC) comprising a capacitive divider circuit, the capacitive divider circuit comprising (i) a first capacitor in parallel with a second capacitor in a first branch, (ii) a plurality of other capacitors in a plurality of other respective branches, and (iii) the CDAC configured to receive the set of sampled voltages and adjust each set of the sampled voltages by a first voltage or a second voltage through selection of one or more capacitors of (i) the first and the second capacitor and (ii) one or more of the plurality of other capacitors, the one or more capacitors selected according to a position of each switch of the plurality of switches;
a comparator circuit configured to generate a polarity value based on a difference between the adjusted set of the sampled voltages; and
a successive approximation register (SAR) circuit configured to (i) receive the polarity value from the comparator, (ii) generate instructions to select the position of each switch of the plurality of switches in the CDAC, (iii) transmit the instructions to the CDAC, (iv) generate a digital representation from the polarity value, and (v) output the digital representation to a digital signal processor.

2. The apparatus of claim 1, further comprising:
a demodulator configured to:
receive data over an optical link;
receive a local oscillator signal from a local oscillator;
process the received data based on the local oscillator signal to generate a resulting signal; and
output the resulting signal to a detector; and
the detector configured to provide the set of voltage signals based on the resulting signal from the demodulator to the ADC.

3. The apparatus of claim 1, wherein the ADC is configured to utilize a binary search to generate the digital representation from the polarity value using the received set of voltages.

4. The apparatus of claim 1, further comprising:
a first ADC configured to receive a set of voltage signals having an X-polarization and generate, using the set of voltage signals having the X-polarized signals to provide as output to the digital signal processor; and
a second ADC configured to receive a set of voltage signals having a Y-polarization and generate, using the set of voltage signals having the Y-polarization, digital representations of Y-polarized signals to provide as output to the digital signal processor.

5. The apparatus of claim 1, further comprising:
The digital signal processor configured to receive the digital representation from the SAR circuit and process the digital representation.

6. The apparatus of claim 1, wherein the first capacitor has a value of 0.5 times the capacitance of an LSB capacitor in the plurality of other capacitors.

7. The apparatus of claim 1, wherein the first branch and the other respective branches of the capacitive divider circuit represents binary coefficients indicative of positions of each switch of the plurality of switches.

8. A receiver comprising:
an analog-to-digital converter (ADC) configured to process a set of voltage signals provided by a detector and generate, using the set of voltage signals, digital representations of signals to provide as output to a digital signal processor, the ADC comprising:
  a sample and hold circuit configured to sample the set of voltages and hold sample voltages for a period of time;
  a capacitive digital-to-analog converter (CDAC) comprising a capacitive divider circuit, the capacitive divider circuit comprising (i) a first capacitor in parallel with a second capacitor in a first branch of the capacitive divider circuit, (ii) a plurality of other capacitors in a plurality of other respective branches of the capacitive divider circuit, and (iii) a plurality of switches for connecting the first capacitor, the second capacitor, and the plurality of other capacitors to a first voltage or a second voltage,
    the CDAC configured to receive the sample voltages and adjust each of the sample voltages by the first voltage or the second voltage through selection of one or more capacitors of the first capacitor, the second capacitor, and the plurality of other capacitors, capacitances of the one or more capacitors selected according to a position of each switch of the plurality of switches;
  a comparator circuit configured to generate a polarity value based on a difference between the adjusted sample voltages; and
  a successive approximation register (SAR) circuit configured to (i) receive the polarity value from the comparator circuit, (ii) generate instructions to select the position of each switch of the plurality of switches in the CDAC, (iv) (iii) transmit the instructions to the CDAC, (iv) generate a digital representation from the polarity value, and (v) output the digital representation to the digital signal processor.

9. The receiver of claim 8, further comprising:
a demodulator configured to:
  receive data over an optical link;
  receive a local oscillator signal from a local oscillator;
  process the received data based on the local oscillator signal to generate a resulting signal; and
  output the resulting signal to the detector; and
the detector configured to provide the set of voltage signals based on the resulting signal from the demodulator to the ADC.

10. The receiver of claim 8, wherein the ADC is configured to utilize a binary search to generate the digital representation from the polarity value using the set of voltages.

11. The receiver of claim 8, further comprising:
a first ADC configured to receive a set of voltage signals having an X-polarization and generate, using the set of voltage signals having the X-polarization, digital representations of X-polarized signals to provide as output to the digital signal processor; and
a second ADC configured to receive a set of voltage signals having a Y-polarization and generate, using the set of voltage signals having the Y-polarization, digital representations of Y-polarized signals to provide as output to the digital signal processor.

12. The receiver of claim 8, wherein the first voltage is a ground voltage and the second voltage is a reference voltage that is not grounded.

13. The receiver of claim 8, wherein the first capacitor has a value of 0.5 times the capacitance of an LSB capacitor in the plurality of other capacitors.

14. The receiver of claim 8, wherein the first branch and the other respective branches of the capacitive divider circuit represents binary coefficients indicative of positions of each switch of the plurality of switches.

15. The receiver of claim 14, wherein the first branch that comprises the first capacitor in parallel with the second capacitor represents a most significant bit (MSB) of the binary coefficients.

16. The receiver of claim 8, further comprising a quantization error profile of the CDAC is uniformly distributed between $-LSB/2$ to $LSB/2$ across the set of voltage signals.

17. A device comprising:
a capacitive digital-to-analog converter (CDAC) comprising a capacitive divider circuit, the capacitive divider circuit comprising (i) a first set of branches connected to either a first voltage or a second voltage, the first set of branches comprising a first branch with a first set of parallel capacitors, (ii) a second set of branches connected to the first voltage or the second voltage, the second set of branches comprising a second branch with a second set of parallel capacitors, and (iii) each branch of the first set of branches connected to a positive input of a comparator and each branch of the second set of branches connected to a negative input of the comparator,
  the CDAC configured to receive a set of sampled voltages and adjust each set of the sampled voltages by the first voltage or the second voltage through selection of a plurality of switches wherein the comparator is configured to generate a polarity value based on a difference between the adjusted set of the sampled voltages and a successive approximation register (SAR) circuit is configured to determine a position of each switch in the plurality of switches based on the polarity value.

18. The device of claim 17, wherein the first voltage is ground and the second voltage is a reference voltage.

19. The device of claim 17, wherein the first branch comprises a first capacitor in parallel with a second capacitor.

20. The device of claim 19, wherein the capacitor has a value of 0.5 times the capacitance of an LSB capacitor in the second set of parallel capacitors.

* * * * *